United States Patent
Kadono et al.

(10) Patent No.: US 7,196,386 B2
(45) Date of Patent: Mar. 27, 2007

(54) MEMORY ELEMENT AND MEMORY DEVICE

(75) Inventors: Koji Kadono, Tokyo (JP); Masafumi Ata, Kanagawa (JP)

(73) Assignee: Sony Corporation, Tokyo (JP)

( * ) Notice: Subject to any disclaimer, the term of this patent is extended or adjusted under 35 U.S.C. 154(b) by 230 days.

(21) Appl. No.: 10/530,006

(22) PCT Filed: Oct. 2, 2003

(86) PCT No.: PCT/JP03/12647

§ 371 (c)(1),
(2), (4) Date: Mar. 31, 2005

(87) PCT Pub. No.: WO2004/032238

PCT Pub. Date: Apr. 15, 2004

(65) Prior Publication Data

US 2006/0006334 A1 Jan. 12, 2006

(30) Foreign Application Priority Data

Oct. 3, 2002 (JP) ............................ 2002-290731
Oct. 3, 2002 (JP) ............................ 2002-290732

(51) Int. Cl.
*H01L 29/82* (2006.01)
(52) U.S. Cl. ........................... 257/421; 365/171
(58) Field of Classification Search ........ 257/E21.665, 257/E51.039, E51.04; 365/171, 173, 158, 365/151; 251/1, 421, 422

See application file for complete search history.

(56) References Cited

U.S. PATENT DOCUMENTS

| 6,532,164 | B2 * | 3/2003 | Redon et al. ............... 365/97 |
| 6,730,395 | B2 * | 5/2004 | Covington ............... 428/811.1 |
| 6,987,302 | B1 * | 1/2006 | Chen et al. ................ 257/368 |
| 2001/0026468 | A1 | 10/2001 | Tanikawa |
| 2002/0158342 | A1 * | 10/2002 | Tuominen et al. .......... 257/784 |
| 2004/0157449 | A1 * | 8/2004 | Hidaka et al. .............. 438/689 |

FOREIGN PATENT DOCUMENTS

| JP | 11-120758 A | 4/1999 |
| JP | 2003-347515 A | 12/2003 |

* cited by examiner

*Primary Examiner*—Sara Crane
(74) *Attorney, Agent, or Firm*—Wolf, Greenfield & Sacks, P.C.

(57) ABSTRACT

A memory element wherein a spin conduction layer having a sufficient spin coherence length and a uniform spin field can be obtained, and thereby practical use is attained and a memory device are provided. A spin conduction layer (paramagnetic layer) (24) is a fullerene thin film being from 0.5 nm to 5 μm thick, for example. The fullerene has a hollow sized, for example, from 0.1 nm to 50 nm. A paramagnetic material is included in this hollow. A fermi vector of the fullerene thin film well laps over small number of spin band or plenty of spin band of a ferromagnetic fixed layer (23) and a ferromagnetic free layer (25). Further, spin orientations of the included paramagnetic material are random. Further, electron spin in the fullerene is in a quantized state in a pseudo zero dimensional space. Thereby, a spin coherence length becomes long in the fullerene thin film, and scatteration of spin-polarized conduction electrons goes away.

36 Claims, 14 Drawing Sheets

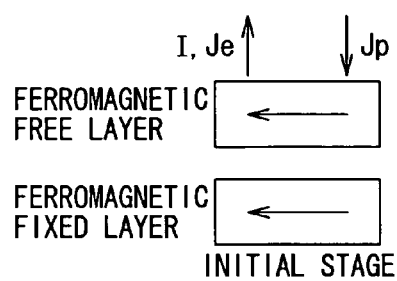 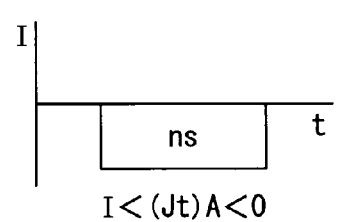 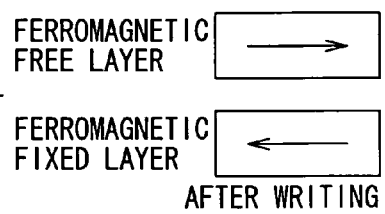
FIG. 4A        FIG. 4B        FIG. 4C
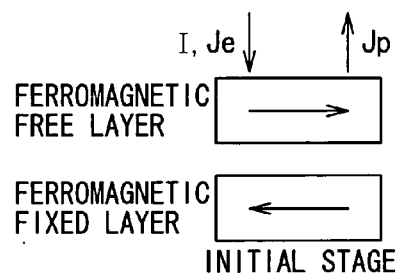 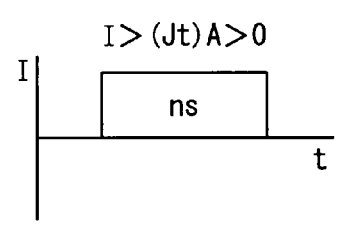 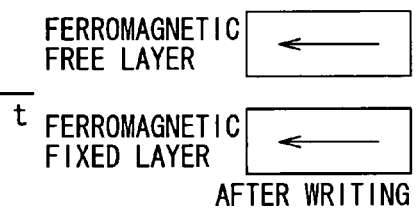
FIG. 5A        FIG. 5B        FIG. 5C

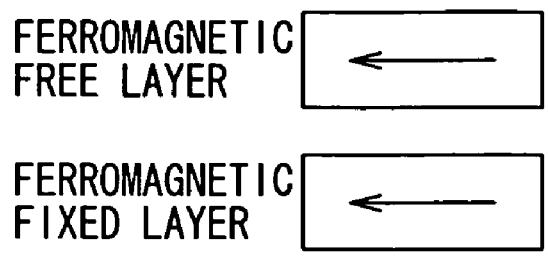 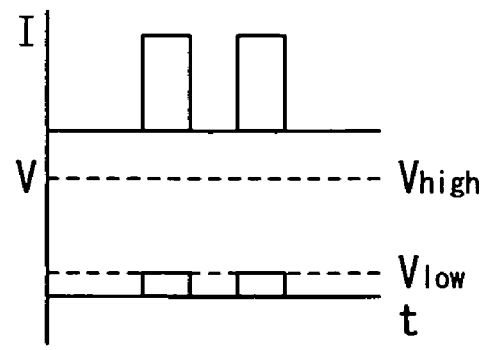
FIG. 6A        FIG. 6B
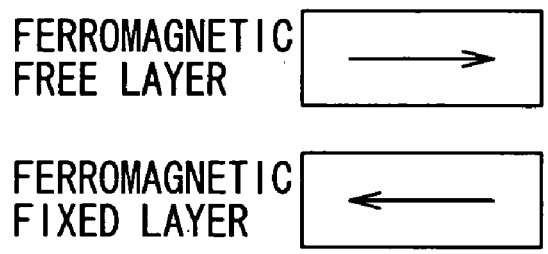 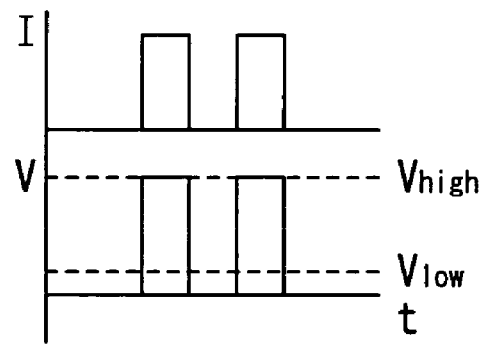
FIG. 7A        FIG. 7B

MEMORY ELEMENT AND MEMORY DEVICE

TECHNICAL FIELD

The present invention relates to a memory element for writing recording information by injecting spin-polarized electrons and a memory device using this memory element.

BACKGROUND ART

Under the circumstances that the high speed network society has come, in the mobile media rapidly becoming popular such as mobile phones and laptop computers, development of nonvolatile memories has been particularly required. The nonvolatile memory can retain data without being always supplied with electric power. Therefore, in the devices using the nonvolatile memory can be run immediately after the power is turned on. Further, power consumption can be reduced.

A Magnetic Random Access Memory (MRAM) recently noted comprises high speed characteristics of a SRAM (Static RAM), high density and lower cost characteristics of a DRAM (Dynamic RAM), and nonvolatile characteristics of a flash memory. Therefore, the MRAM is considered as a promising memory of a future de facto standard. The MRAM is a memory using magnetic effects. Of the MRAM, a spin valve type memory utilizing giant magnetoresistive effects, and a memory utilizing spin dependent type tunneling effects are known. In these MRAMs, a switching current is applied to a wiring corresponding to a targeted memory cell and a magnetic field is generated, by which a magnetization state of a recording layer in the cell is changed and bit information is written. Information is read by detecting a magnetization state of the cell by utilizing magnetic effects. As above, the MRAM is a solid-state memory. Therefore, there is no risk of damage, which might occur in a magnetic recording medium for performing writing and reading mechanically by using a magnetic head. The MRAM also excels at repeating writing and reading.

However, for practical use of the MRAM, problems caused along with high density of memories have been left. A magnetic strength required for writing is in inverse proportion to a width of a recording layer, that is, a cell size. Therefore, when a memory cell is miniaturized, a consumption power becomes very large. Further, there is a risk that cross talk may be caused by a proximate leakage magnetic field between adjacent cells. For example, for a memory cell being 0.2 μm wide, a current in writing becomes several mA. Further, for a memory whose cell distance narrows down to about 0.1 μm, when a magnetic field is induced for a targeted cell, a magnetic field having 80% intensity thereof is applied to its adjacent cell.

As a technique to solve the foregoing problems, a MRAM using a new writing method called polarized spin injection method to a recording layer has been suggested (refer to Japanese Unexamined Patent Application Publication No. H11-120758). This memory element is constructed as in FIG. 22. That is, a ferromagnetic layer (fixed layer) 111 wherein a magnetization direction is always fixed and a ferromagnetic layer (free layer) 112 wherein a magnetization direction is changed according to bit information are separated by a paramagnetic layer 113. Paramagnetic metal layers 114 and 115 are electrode layers for applying a current in the laminating direction to the ferromagnetic layers 111 and 112. In the polarized spin injection method, polarized electrons are injected into the ferromagnetic layers 111 and 112 and a spin angular momentum is conveyed by applying a spin polarized current in the laminating direction. Thereby, in the ferromagnetic layer 112, a magnetic moment is inverted by interaction. This mechanism is called spin conversion. In the writing method wherein magnetization is switched by injecting a spin current as above, there is no need to apply an external magnetic field. Therefore, it is free from interference between memory cells, and power consumption can be restrained. The polarized spin injection method is further characterized in that its writing time depends on only a spin conduction rate. Therefore, a response rate can be improved.

However, in this technique, there has been also a problem for practical use. The paramagnetic layer 113 arranged between the ferromagnetic layers 111 and 112 has an aspect as a spin conduction layer for conducting the polarized spin of electrons without relaxation, in addition to a role as a magnetic spacer. Therefore, it is necessary that the paramagnetic layer 113 is made of a material having a long spin coherence length and having a very small spin scatteration to the ferromagnetic layers 111 and 112.

That is, when a spin orientation is changed by, for example, scatteration of spin-polarized conduction electrons in the paramagnetic layer 113, spin information of the conduction electrons have becomes lost. Therefore, the paramagnetic material having a long spin coherence length is desired. To date, researches on spin conduction of the paramagnetic layer have been conducted by using a paramagnetic metal material, a semiconductor material and the like.

However, when the foregoing material is used for the paramagnetic layer, it is difficult to grow a uniform thin film, and to control the spin coherence length. Therefore, there has been a problem that a sufficient spin coherence length and a uniform spin field cannot be obtained in the paramagnetic layer. In the result, regarding the memory element of the spin injection method, though it is theoretically shown that significant effects can be obtained compared to the conventional induced magnetic field method, sufficient characteristics have not been obtained practically. Therefore, its practical use has not been attained.

In view of the foregoing, it is an object of the invention to provide a memory element capable of obtaining a sufficient spin coherence length and a uniform spin field in the paramagnetic layer, and thereby attaining practical use thereof, and a memory device using it.

DISCLOSURE OF THE INVENTION

A memory element according to the invention is a memory element wherein recording information is written by injecting spin-polarized electrons comprising: a spin conduction layer made of a spherical shell or cylindrical molecule material having a hollow, and wherein the spin-polarized electrons are conducted by the spin conduction layer.

More specifically, the memory element of the invention is a memory element primarily comprising: a first ferromagnetic layer wherein a magnetization direction is fixed; a spin conduction layer made of a spherical shell molecule material having a hollow in which a paramagnetic material is included and having a given spin coherence length, which is formed over the first ferromagnetic layer; and a second ferromagnetic layer formed on the spin conduction layer on the side opposite to the first ferromagnetic layer, wherein a magnetization direction is changed by the spin-polarized electrons, wherein the recording information is written by changing the magnetization direction of the second ferromagnetic layer.

In this memory element, when the spin-polarized electrons are injected into the second ferromagnetic layer, the magnetization direction of the second ferromagnetic layer is changed, and the recoding information is written. Then, a spin-polarized electron flow flows without spin scattering through the paramagnetic layer made of the spherical molecule material including the paramagnetic material (for example, carbon molecule fullerene) which has a sufficient spin coherence length and a uniform spin field. That is, the injected electrons are conducted through the paramagnetic layer while their spin polarization degree is maintained.

Secondly, a memory element of the invention is a memory element comprising: first and second ferromagnetic layers wherein a magnetization direction change of at least one thereof is induced by injecting the spin-polarized electrons; and a spin conduction layer constructed from at least part of a hollow cylindrical molecule (for example, carbon nanotube) arranged by setting its axis direction to a laminating direction of the first and the second ferromagnetic layers, which is provided between the first ferromagnetic layer and the second ferromagnetic layer to shield magnetic interaction thereof and which conducts the spin-polarized electrons.

In the memory device, a current flows in the axis direction of the hollow cylindrical molecule functioning as the spin conduction layer. Thereby, the spin-polarized electrons are conducted between the first ferromagnetic layer and the second ferromagnetic layer. In the spin conduction layer, electrons are conducted without spin relaxation according to a spin coherence length of the cylindrical molecule or a substance included in a hollow part thereof, and an angle momentum thereof is given to the first ferromagnetic layer and the second ferromagnetic layer.

The memory device of the invention is constructed by arraying a plurality of memory elements of the invention described above.

BRIEF DESCRIPTION OF THE DRAWINGS

FIGS. 4A to 4C are pattern diagrams for explaining an operation of writing into the memory cell;

FIGS. 5A to 5C are also pattern diagrams for explaining the operation of writing;

FIGS. 6A and 6B are pattern diagrams showing a reading signal to the memory cell;

FIGS. 7A and 7B are also pattern diagrams showing the reading signal;

BEST MODES FOR CARRYING OUT THE INVENTION (First Embodiment)

Figure 1:
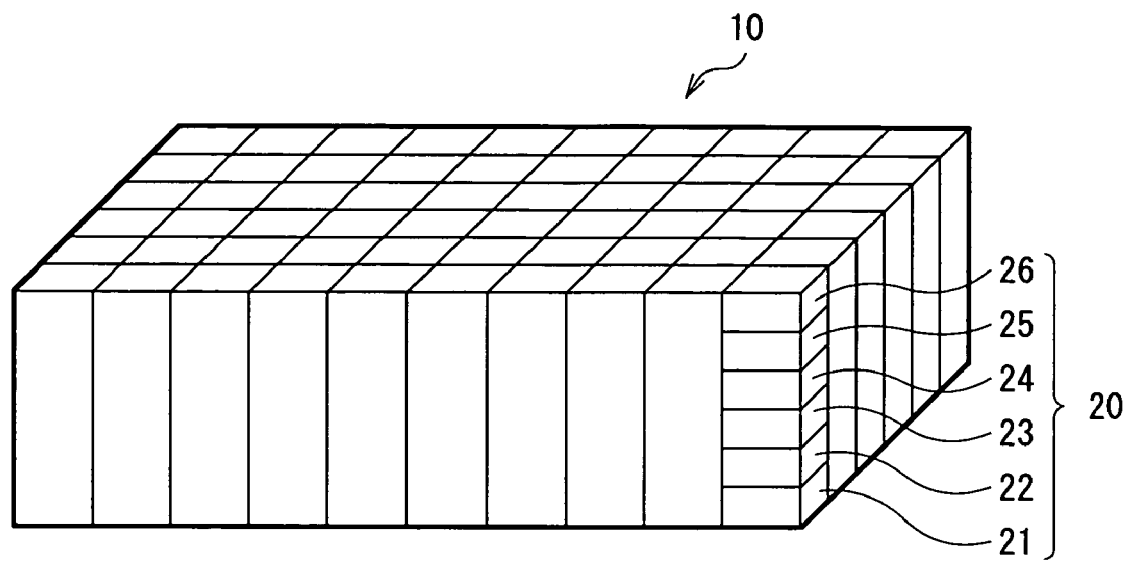
FIG. 1 is a pattern diagram showing an outline construction of a memory element according to a first embodiment of the invention.
Figure 2:
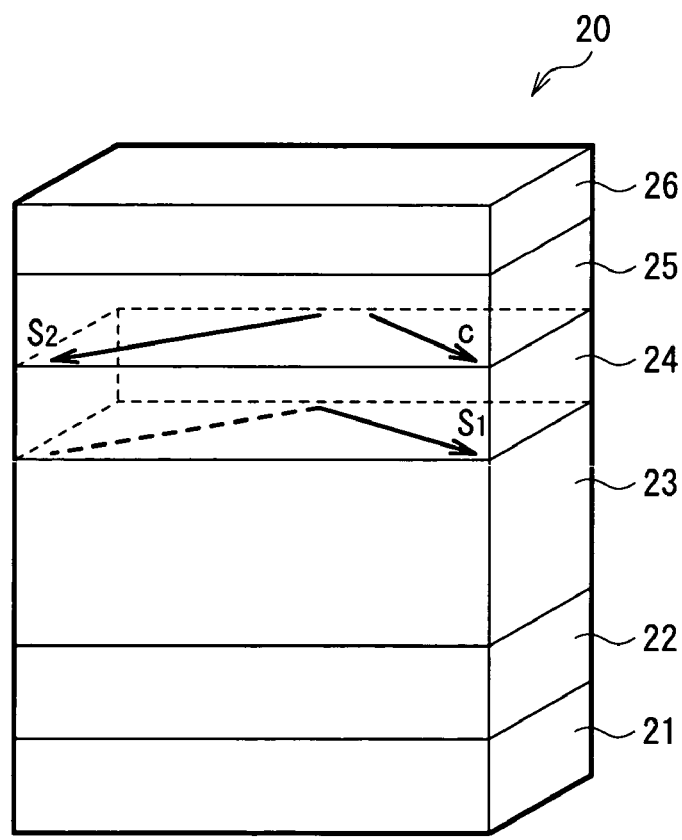
FIG. 2 is a pattern diagram of a memory cell.

FIG. 1 shows a construction of a memory element according to a first embodiment of the invention. The memory element MM1 is a "spin injection type" element for performing writing by causing magnetization inversion by injecting polarized spin electrons. FIG. 2 shows a taken out memory cell 20 constructing the memory element MM1.

The memory element MM1 is a memory element wherein a plurality of memory cells 20 are arrayed in a state of a matrix (for example, array of M columns and N lines: M×N array). Recording information of the memory cell 20 is written by injecting a spin-polarized electron flow into each memory cell 20 (spin injection method). It is preferable that an in-plane size of this memory cell 20 is from 0.5 $nm^2$ to 5 $\mu m^2$. When the size of the memory cell is small, cross talk may be caused. It becomes possible to inhibit influence of a magnetic field due to a writing current to the adjacent respective memory cells 20 each other by setting to the foregoing size.

The memory cell 20 comprises a substrate 21. An electrode layer 22 is formed on the substrate 21. A ferromagnetic fixed layer (first ferromagnetic layer) 23 made of a ferromagnetic material is formed on the electrode layer 22. In the ferromagnetic fixed layer 32, a magnetization direction is fixed in a given direction. A spin conduction layer 24 is formed on the ferromagnetic fixed layer 23. In this embodiment, the spin conduction layer 24 is made of a spherical shell molecule material including a paramagnetic material, for example, carbon molecule fullerene. Detailed description thereof will be given later. A ferromagnetic free layer (second ferromagnetic layer) 25 made of a ferromagnetic material is formed on the spin conduction layer 24. The ferromagnetic free layer 25 has two stable magnetization directions, and is oriented to one of two magnetization directions. The magnetization direction of the ferromagnetic free layer 25 is changed according to spin of conduction electrons. An electrode layer 26 is formed on the ferromagnetic free layer 25.

The substrate 21 is, for example, made of silicon (Si). The electrode layers 22 and 26 are made of a paramagnetic metal such as gold (Au). As the paramagnetic metal, any material other than gold can be used as long as a wiring can be easily fabricated with such a material to the electrode layers 22 and 26 by deposition method, sputtering method and the like.

Figure 3:
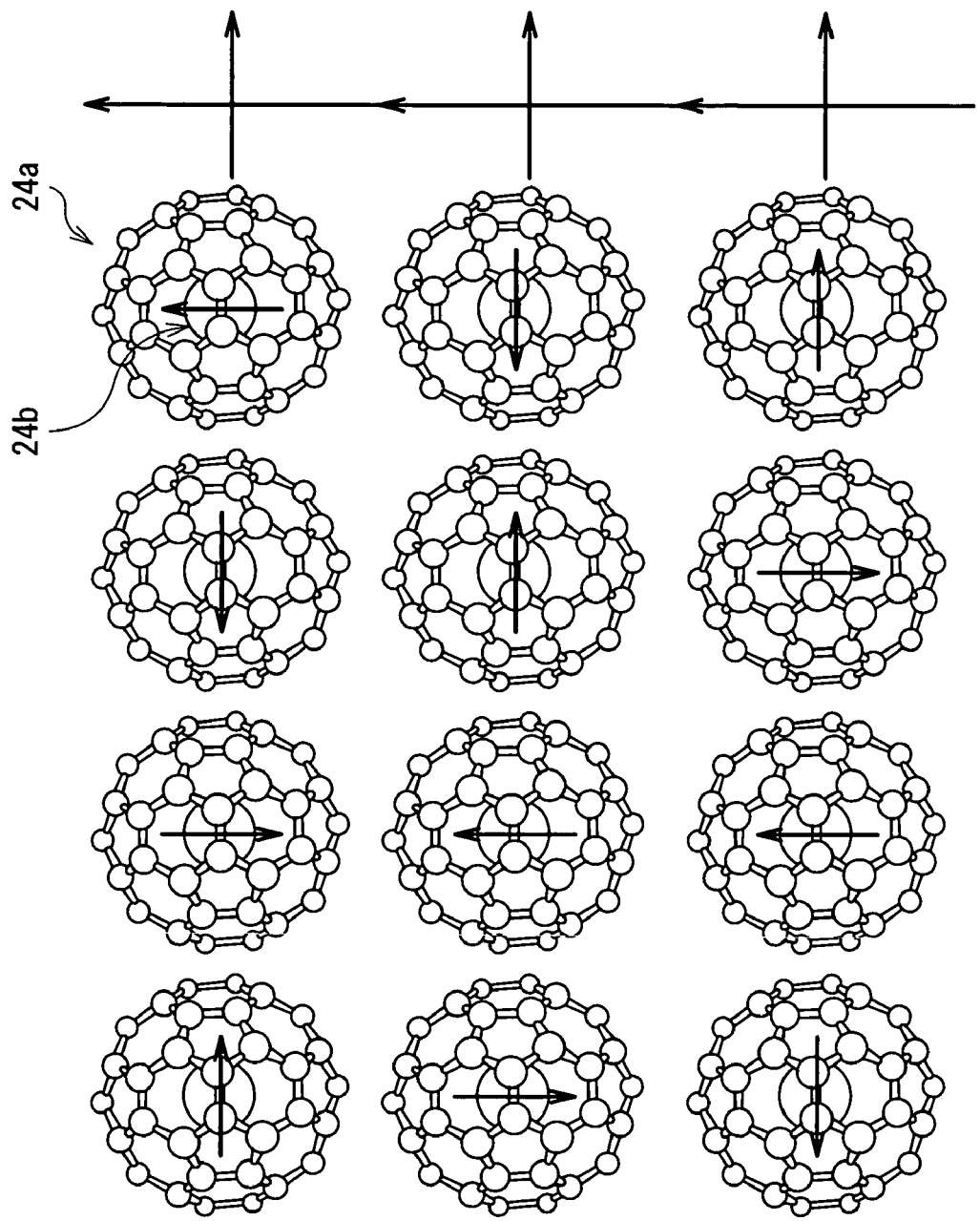
FIG. 3 is a view for explaining a crystal structure of a fullerene thin film used for a spin conduction layer (paramagnetic layer)

The spin conduction layer 24 is a fullerene thin film made of a fullerene 24a including a paramagnetic material 24b as mentioned above. A thickness thereof is, for example, from 0.5 nm to 5 μm. Such a fullerene thin film has a crystal structure as shown in FIG. 3. The fullerene thin film generally has a crystal structure of fcc. However, in this figure, it is expressed by a two dimensional simple lattice for convenience.

The fullerene 24a has a hollow sized, for example, from 0.1 nm to 50 nm. In this hollow part, the paramagnetic material 24b is included. Examples of the fullerene 24a include $C_{36}$, $C_{60}$, $C_{70}$, $C_{72}$, $C_{74}$, $C_{76}$, and $C_{82}$. Examples of the paramagnetic material 24b include rare earth elements such as lanthanum (La), cesium (Cs), dysprosium (Dy), europium (Eu), and gadolinium (Gd); and nonmetallic elements such as N (nitride) and P (phosphorus).

Further, in the fullerene thin film, spin orientations of the included paramagnetic material 24b are random. Therefore, the fullerene thin film has stable paramagnetism. Further, electron spin in the fullerene 24a is in a quantized state in a pseudo zero dimensional space. Therefore, in the fullerene thin film, spin relaxation time becomes long, that is, a spin coherence length becomes long. In the result, when electrons are conducted through the fullerene 24a, spin is never scattered. For example, when electrons are conducted in the vertical direction as shown in the figure, the electrons can be conducted while a spin polarization degree is maintained.

In this embodiment, as shown in FIG. 2, the magnetization direction of the ferromagnetic fixed layer 23 is fixed in a magnetization direction $S_1$. Meanwhile, the magnetization direction of the ferromagnetic free layer 25 is one of two stable magnetization directions $S_1$ and $S_2$, for example, $S_2$. In the ferromagnetic free layer 25, when the spin-polarized electron flow is injected, the magnetization direction is rotated. Two magnetization directions of the ferromagnetic free layer 25 correspond to two types of recording information in the memory cell 20. These two types of recording information are read as signals, "1" and "0." In FIG. 2, the magnetization directions $S_1$ and $S_2$ are depicted as orthogonal coordinate axes.

In this embodiment, the following ferromagnetic materials are selectively used so that the ferromagnetic fixed layer 23 and the ferromagnetic free layer 25 have functions different from each other.

Simple Substance:

| (110) orientation | bcc | Fe |
| (001) orientation | bcc | Fe |
| C axis in-plane orientation | hcp | Co |
| (111) orientation | fcc | Co |
| (110) orientation | fcc | Co |
| (001) orientation | fcc | Co |

Binary Alloy:
$Fe_{1-x}Co_x$ (0<x<1)
$Ni_xFe_{1-x}$ (0<x<0.75)
$Ni_{79}Fe_{21}$ (permalloy)
Tertiary Alloy:
MnFeCo
FeCoNi Here, selection of the foregoing ferromagnetic materials is in accordance with the following conditions. For example, when the same ferromagnetic material is used for the ferromagnetic fixed layer 23 and the ferromagnetic free layer 25, the ferromagnetic fixed layer 23 is formed thicker than the ferromagnetic free layer 25. When the material for the ferromagnetic fixed layer 23 is different from the material for the ferromagnetic free layer 25, selection is made so that the material for the ferromagnetic fixed layer 23 has a very larger gilbert attenuation coefficient compared to that of the material for the ferromagnetic free layer 25.

Further, when the materials for each layer of the ferromagnetic fixed layer 23 and the ferromagnetic free layer 25 have current polarization efficiencies different from each other, it becomes possible that writing currents and writing times required in writing from recording information "0" to "1" or from "1 to "0." can be values different from each other. Providing the writing current with asymmetry postulate is advantageous in constructing a circuit, for example, a polarity capable of reducing a current required per cell can be selected when all memory cells 20 on the chip are concurrently cleared.

Further, as mentioned above, since the ferromagnetic free layer 25 has two stable magnetization directions, it is important that the ferromagnetic free layer 25 has uniaxial anisotropy in the layer. That is, the ferromagnetic free layer 25 needs to have magnetic field Hu with uniaxial anisotropy larger than 100 Oe (oersted), which is free from influence of heat or fluctuation of magnetic field. Further, uniaxial anisotropy of the ferromagnetic fixed layer 23 have to be larger than that of the ferromagnetic free layer 25. When a ferromagnetic material having magnetic field Hu with small uniaxial anisotropy is used for the ferromagnetic free layer 25, it is easy to switch the magnetization direction between $S_1$ and $S_2$. However, CCP voltage measurement for this system requires subtle experimental conditions. That is, a memory cell fabricated from a material having magnetic field Hu with too small uniaxial anisotropy is not suitable as a practical device. Such uniaxial anisotropy can be obtained by controlling composition, shape, crystal orientation, and lattice strain of the ferromagnetic material, or by controlling a magnetic field applied in forming these layers. More specifically, as a ferromagnetic thin film having uniaxial anisotropy, the following can be cited.

For example, the (110) face bcc iron which is magnetized along magnetizable axis direction determined by magnetic anisotropy (<001>direction) has magnetic field Hu with a high polarization ratio and high uniaxial anisotropy. Further, for example, the permalloy which is deposited under the existence of a bias magnetic field and provided with uniaxial induced magnetic anisotropy parallel to the magnetic field has magnetic field Hu with optimal polarization efficiency and small uniaxial anisotropy. Further, for example, the hcp cobalt comprising uniaxial anisotropy in the direction of in-plane c axis has magnetic field Hu with high polarization efficiency and high uniaxial anisotropy. In addition, the $Fe_{1-x}Co_x$ alloy having bcc structure by, for example, Co substitution by x % in Fe lattice site has its film face of (110), and has a magnetizable axis with in-plane uniaxial magnetic anisotropy in the direction of <100>. The $Fe_{1-x}Co_x$ alloy has magnetic field Hu with the largest polarization efficiency and large uniaxial anisotropy.

Further, when a magnetization direction is changed in the plane of the layer in the ferromagnetic free layer 25, it is possible to optimize anisotropic magnetic field Hu by selecting a fineness ratio of a rectangle shape whose short side is 1 μm or less. Meanwhile, when a magnetization direction is changed between the in-plane of the ferromagnetic free layer 25 and the direction perpendicular to the in-plane, it is preferable that a thickness of the ferromagnetic free layer 25 is 5 atomic layers or less in order to obtain sufficient vertical magnetic anisotropy. That is, it is preferable that the thickness of the ferromagnetic free layer 25 is about 1 nm. This thickness is a transition region between a case that the magnetization direction becomes in the in-plane direction and a case that the magnetization direction becomes perpendicular to the in-plane. Further, as a polarization electron source for the ferromagnetic fixed layer 23 and the ferromagnetic free layer 25, a whistler alloy such as PtMnSb or a metalloid material can be used.

Next, operation of the memory element MM1 having such a construction will be hereinafter described. In this memory element MM1, a magnetization direction of the ferromagnetic fixed layer 23 is fixed to a given direction $S_1$. Meanwhile, the ferromagnetic free layer 25 has two stable magnetization directions $S_1$ and $S_2$, and is oriented to one of these magnetization directions (here, $S_2$). In such a memory element MM1, two magnetization directions of the ferromagnetic free layer 25 correspond to two recording information in each memory cell 20. Recording information "1" or "0" is written by injecting a spin-polarized electron flow into the ferromagnetic free layer 25 and switching the magnetization direction. Meanwhile, reading the recording information is performed by utilizing giant magnetoresistive effects (GMR) generated by vertically applying a current in the memory cell 20.

When recording information is written, a pulse current is used in order to switch the magnetization direction of the ferromagnetic free layer 25, and magnetic switching (magnetic inversion) of the ferromagnetic free layer 25 is performed. For example, writing in the case that an initial state is parallel magnetization alignment (FIG. 4A) is performed as follows. That is, electron particle density pulse Jp with spin in the same direction as of the spin in the ferromagnetic free layer 25 flows from the ferromagnetic free layer 25 to the ferromagnetic fixed layer 23. Then, the ferromagnetic fixed layer 23 is exclusively in a state of spin in the same direction as of the electron particle density pulse Jp. Therefore, spin of the electron particle density pulse Jp injected into the ferromagnetic fixed layer 23 is inverted based on the Pauli exclusion principle. An electron flow having such inverted spin flows in the direction opposite to of the electron particle density pulse Jp as current density pulse Je (switching current I), and therefore, the direction of the spin of the ferromagnetic free layer 25 is inverted. As shown in FIG. 4B, the switching current I is larger than the critical value Jt (A) in a joint region, and pulses are maintained in units of nanosecond.

As described above, the magnetization direction of the ferromagnetic free layer 25 is inverted by the switching current I, the magnetization direction of the ferromagnetic free layer 25 becomes opposite to of the ferromagnetic fixed layer 23, and it becomes in a state of anti-parallel magnetization alignment (FIG. 4C). Thereby, writing is finished. The "parallel magnetization alignment" means that the magnetization directions of the ferromagnetic free layer 25 and the ferromagnetic fixed layer 23 are the same. Further, the "anti-parallel magnetization alignment" means that the magnetization directions of the ferromagnetic free layer 25 and the ferromagnetic fixed layer 23 are opposite.

Further, in the case that writing is performed when, for example, an initial state is the anti-parallel magnetization alignment (FIG. 5A), respective flowing directions of the electron particle density pulse Jp and the current density pulse Je become opposite to each other. The electron particle density pulse Jp flows from the ferromagnetic fixed layer 23 to the ferromagnetic free layer 25, and the electron density pulse Je (switching current I) flows in the direction opposite to of the electron particle density pulse Jp, and thereby writing is started. That is, the electron particle density pulse Jp with spin in the same direction as of the spin in the ferromagnetic fixed layer 23 flows from the ferromagnetic fixed layer 23 to the ferromagnetic free layer 25.

Then, spin whose direction is different from of the spin in the ferromagnetic free layer 23 is injected in the ferromagnetic free layer 23. The spin of the ferromagnetic free layer 23 is torqued by this injected spin, and inverted. A current flow having this inverted spin flows in the direction opposite to of the electron particle density pulse Jp as the current density pulse Je (switching current I). As shown in FIG. 5B, the switching current I is larger than the critical value Jt (A) in the joint region, and pulses are maintained in units of nanosecond. As described above, the magnetization direction of the ferromagnetic free layer 25 is inverted by the switching current I, the magnetization direction of the ferromagnetic free layer 25 becomes the same as of the ferromagnetic fixed layer 23, and it becomes in a state of parallel magnetization alignment (FIG. 5C). Thereby, writing is finished.

Meanwhile, when recording information is read, for example, arrangement is set to CPP in which a current is vertically applied in the memory cell 20, and giant magnetoresistive effects are utilized. For example, in the case of the state of parallel magnetization alignment (FIG. 6A), when a reading current pulse of the critical value Jt or less is applied, low voltage pulse $V_{low}$ corresponding to logic "0" can be obtained (FIG. 6B). Further, for example, in the case of the state of anti-parallel magnetization alignment (FIG. 7A), when a reading current pulse of the critical value Jt or less is applied, high voltage pulse $V_{high}$ corresponding to logic "1" can be obtained (FIG. 7B).

When such a reading method is adopted, in order to obtain, for example, 5% or more of GMR ratio (ΔR/R), it is preferable that polarizations $Pol_1$ and $Pol_2$ of electrons of materials constructing the respective layers, the ferromagnetic fixed layer 23 and the ferromagnetic free layer 25, satisfy the following Mathematical formula 1.

$$\frac{2 \cdot Pol_1 \cdot Pol_2}{1 - Pol_1 \cdot Pol_2} > 0.3 \qquad \text{(Mathematical formula 1)}$$

Figure 8:
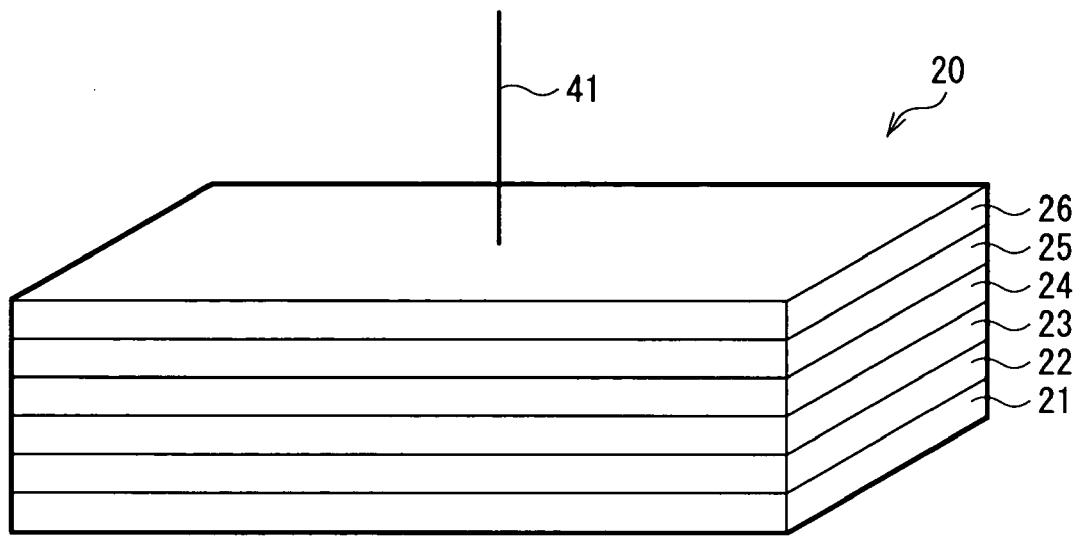
FIG. 8 is a view for explaining an addressing scheme of the memory cell.
Figure 9:
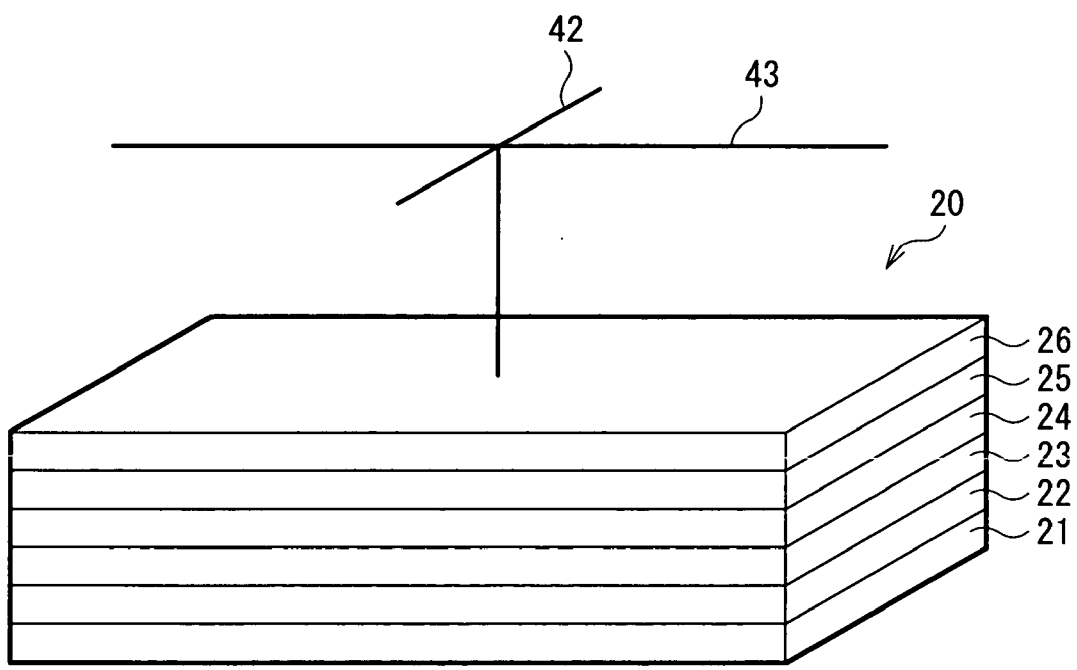
FIG. 9 is also a view for explaining the addressing scheme.

As an addressing scheme for such a memory element MM1, the simplest method is used. For example, as shown in FIG. 8, a method wherein one write only wiring 41 is used for one memory cell 20 can be cited. Further, for example, as shown in FIG. 9, so-called xy addressing scheme wherein wirings 42 and 43 are provided so that the wirings 42 and 43 cross, the memory cell 20 is arranged at the intersection of these wirings 42 and 43, and addressing is made by combination of signals to the wirings 42 and 43 can be cited.

In the case of the addressing scheme having the write only wiring 41, wire connection required for one memory cell 20 is made at one place in the electrode layer 22 and two places in the electrode layer 26, and pseudo four terminal measurement is performed. In some cases, it is enough to perform two terminal measurement wherein wire connection is made at one place respectively in the electrode layers 22 and 26.

In the case of the xy addressing scheme, only when a pulse is concurrently applied to both the x and y wirings 43 and 44, a current over the writing critical current is applied, and thereby, the memory cell 20 is selected. Then, it is possible that in order to assure correspondence of the pulse in the memory cell 20 wherein writing is performed, a long pulse is given to one of the x wiring and y wiring (for example, x wiring), and a short pulse is given to the other wiring (y wiring).

Figure 10:
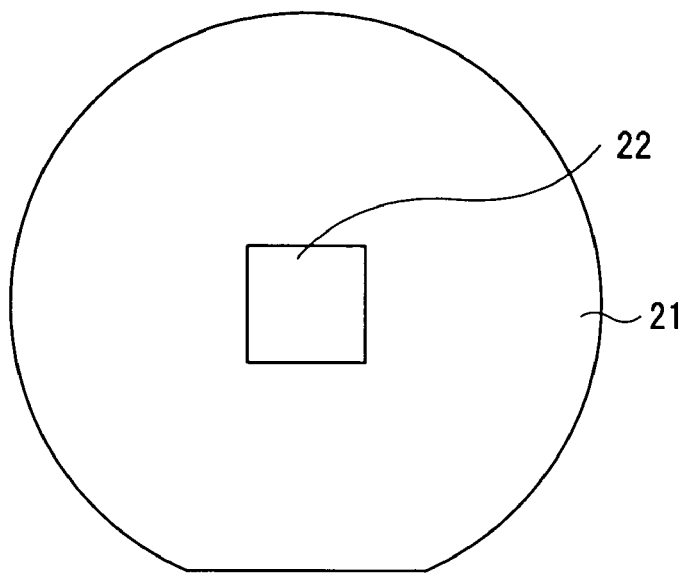
FIG. 10 is a plan view for explaining a step of manufacturing the memory element shown in FIG. 1.
Figure 12:
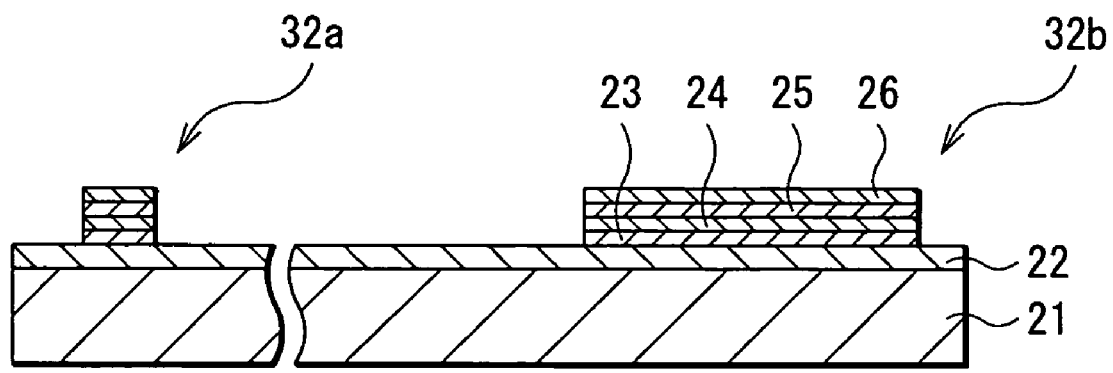
FIG. 12 is a cross section of a step following FIG. 11C.
Figure 13:
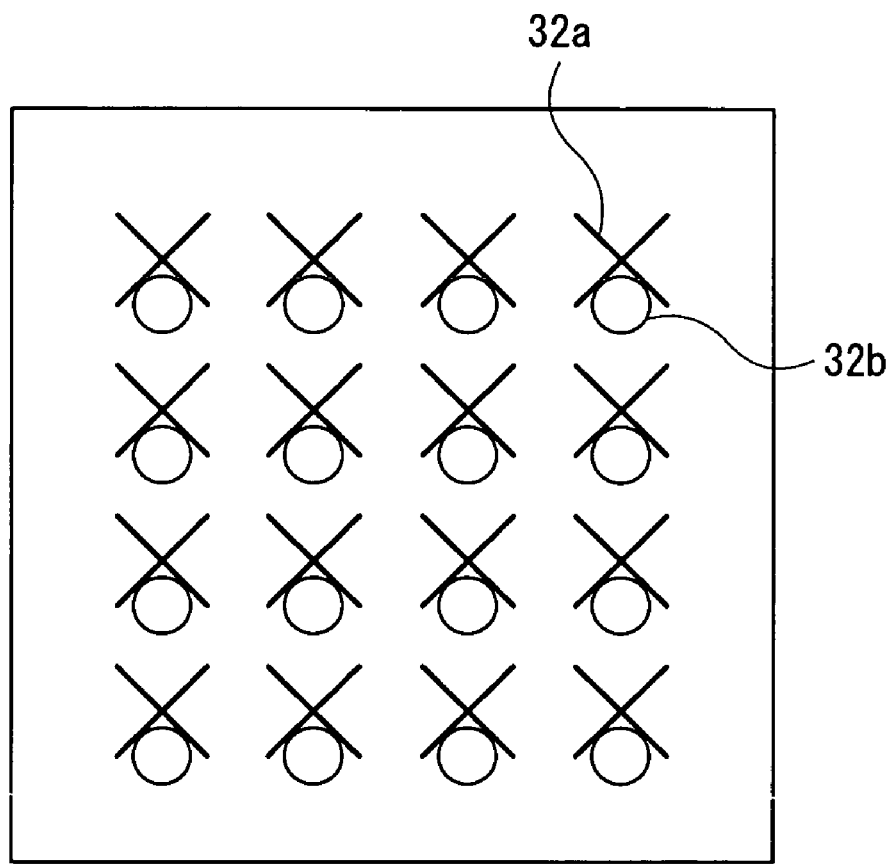
FIG. 13 is a plan view of FIG. 12.

Next, a method of manufacturing the foregoing memory element MM1 will be hereinafter described with reference to FIGS. 10 to 16. FIG. 10 is a plan view of FIG. 11A; FIG. 13 is a plan view of FIG. 12; and FIG. 16 is a plan view of FIG. 15C.

Figure 11A:
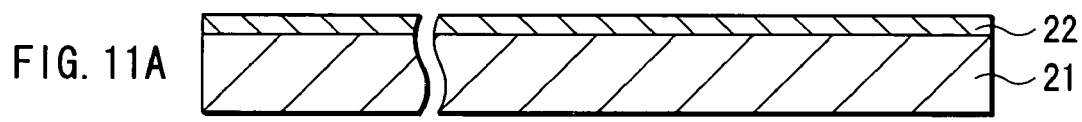
FIGS. 11A to 11C are cross sections of steps following FIG. 10.

First, as shown in FIGS. 10 and 11A, the substrate 21 made of, for example, silicon is prepared. The substrate 21 is not provided with doping, and, for example, is 4 inches in outer diameter and 0.01 inches thick. Further, since a formation region of the electrode 22 is carved out in a subsequent step, the substrate 21 is carved by a diamond point. After a surface of the substrate 21 is polished, the substrate 21 is washed and provided with oxidation treatment. Next, the electrode layer 22 made of, for example, Au is deposited in a region in the approximately in-plane center of the substrate 21 (the size of 2 cm×2 cm, for example), for example, by deposition method. A thickness of the electrode layer 22 is set to, for example, 0.5 μm.

Figure 11B:
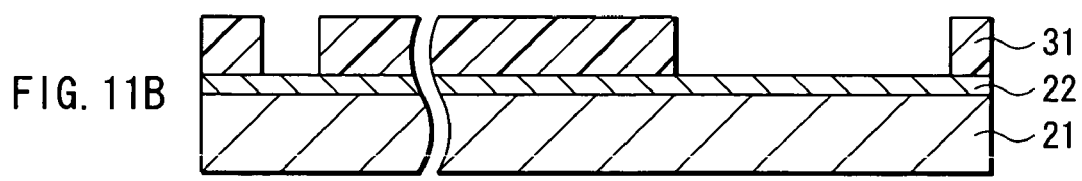

Next, as shown in FIG. 11B, a resist film 31 being 50 nm or more thick is formed on the electrode layer 22, for example, by photolithography method. Then, the resist film 31 is provided with patterning according to a shape of the memory cell 20.

Figure 11C:
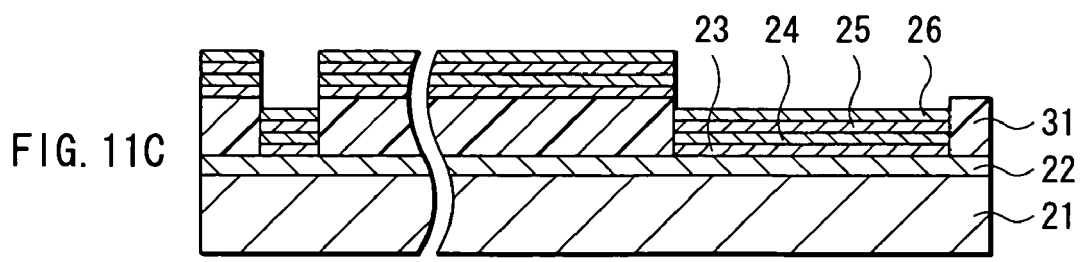

Subsequently, as shown in FIG. 11C, the ferromagnetic fixed layer 23 made of a permalloy having a composition of $Ni_{81}Fe_{19}$ is deposited by, for example, deposition method. A thickness of the ferromagnetic fixed layer 23 is set to, for example, 4 nm. Further, when the ferromagnetic fixed layer 23 is deposited, uniaxial anisotropy are induced while 100 Oe of magnetic field is applied.

Next, the spin conduction layer 24 being 20 nm thick made of, for example, $C_{82}$ including La (La@$C_{82}$) is deposited by, for example, plasma deposition method. $C_{82}$ has a hollow sized, for example, from 0.1 nm to 50 nm. La is included in this hollow. Then, the uniaxial anisotropy of the ferromagnetic fixed layer 23 is retained. More specifically, in the plasma deposition method, a plasma polymerization apparatus of, for example, external electrode capacity combination type or parallel flat sheet electrode capacity combination type is used (for example, refer to Japanese Unexamined Patent Application Publication No. H08-59220). This plasma polymerization apparatus is provided with a molybdenum boat connected to a plasma power source in a reaction vessel. $C_{82}$ powders are housed in this molybdenum boat. The substrate 21 over which the ferromagnetic fixed layer 23 is deposited is arranged in the position facing to the molybdenum boat in the reaction vessel.

By using such a plasma polymerization apparatus and setting the plasma power source to, for example, AC 13.56 MHz, and an output to 150 W, positive ion plasma of La is generated in a constant flow system, $C_{82}$ powders in the molybdenum boat are sublimated at several 100° C., and the spin conduction layer 24 made of La@$C_{82}$ is deposited on the ferromagnetic fixed layer 23 of the substrate 21. In this embodiment, the spin conduction layer 24 is deposited by the fullerene including the paramagnetic material (for example, La@$C_{82}$). Therefore, it is possible to grow a uniform thin film, and control the spin coherence length.

Next, the ferromagnetic free layer 25, for example, being 1 nm thick made of the permalloy is deposited on the spin conduction layer 24 by, for example, deposition method. Then, by performing deposition while applying a magnetic field similar to in depositing the ferromagnetic fixed layer 23, uniaxial magnetic anisotropy are induced in the ferromagnetic free layer 25, so that the c axis of the ferromagnetic free layer 25 becomes parallel to the magnetization of the ferromagnetic fixed layer 23. Thereby the ferromagnetic free layer 25 has two stable magnetization directions $S_1$ and $S_2$, and is oriented to one of these magnetization directions $S_1$ and $S_2$.

Subsequently, the electrode layer 26 being 25 nm thick made of, for example, gold is deposited by deposition method. Next, as shown in FIGS. 12 and 13, lift-off is performed by dissolving and removing the resist film 31. A memory cell part 32a and an earth terminal part 32b are thereby formed selectively.

Figure 14A:
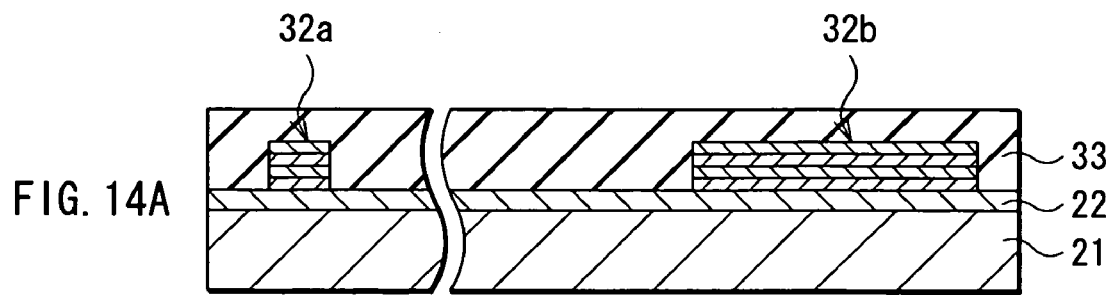
FIGS. 14A to 14C are cross sections of steps following FIG. 12.
Figure 14B:
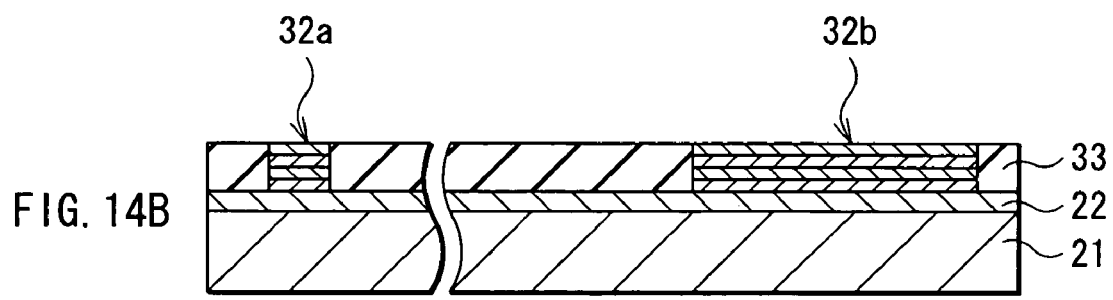
Figure 15A:
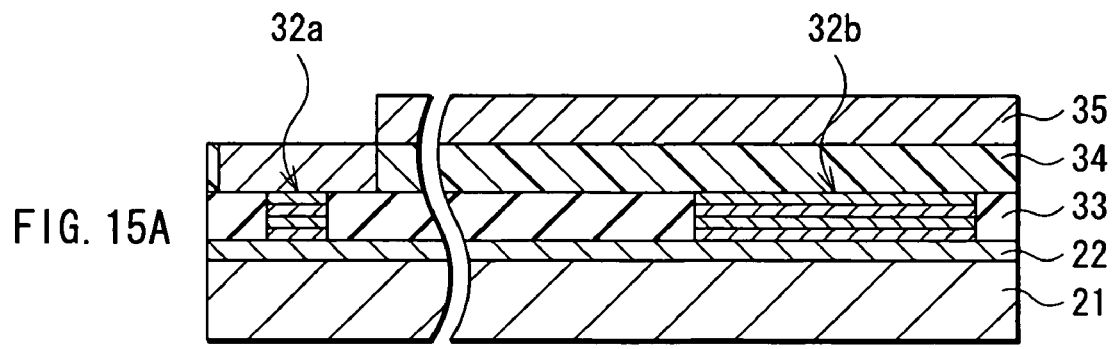
FIGS. 15A to 15C are cross sections of steps following FIG. 14C.

Next, as shown in FIG. 14A, an insulating layer 33 made of polymethyl methacrylate being, for example, 60 nm thick is formed over the substrate 21 to cover the memory cell part 32a and the earth terminal part 32b. The insulating layer 33 functions as a planarizing film. Next, as shown in FIG. 14B, top faces of the memory cell part 32a and the earth terminal part 32b are exposed by, for example, oxygen plasma etching method.

Figure 14C:
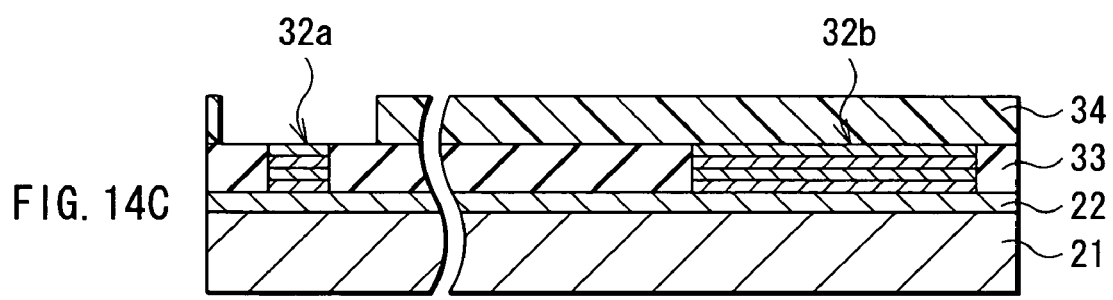

Subsequently, a resist film 34 is selectively formed as shown in FIG. 14C. The resist film 34 has a pattern to cover the earth terminal part 32b and to expose the memory cell part 32a. A thickness of the resist film 34 is set to, for example, 0.2 μm. Next, as shown in FIG. 15A, a gold layer 35 made of, for example, Au is deposited to cover the resist film 34.

Figure 15B:
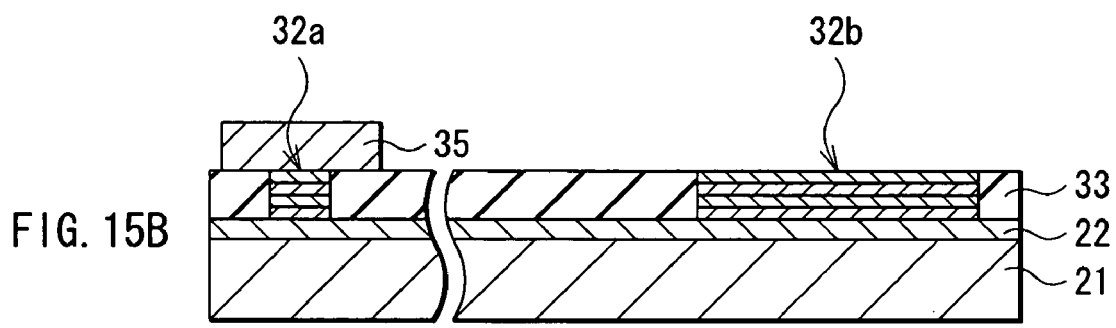
Figure 16:
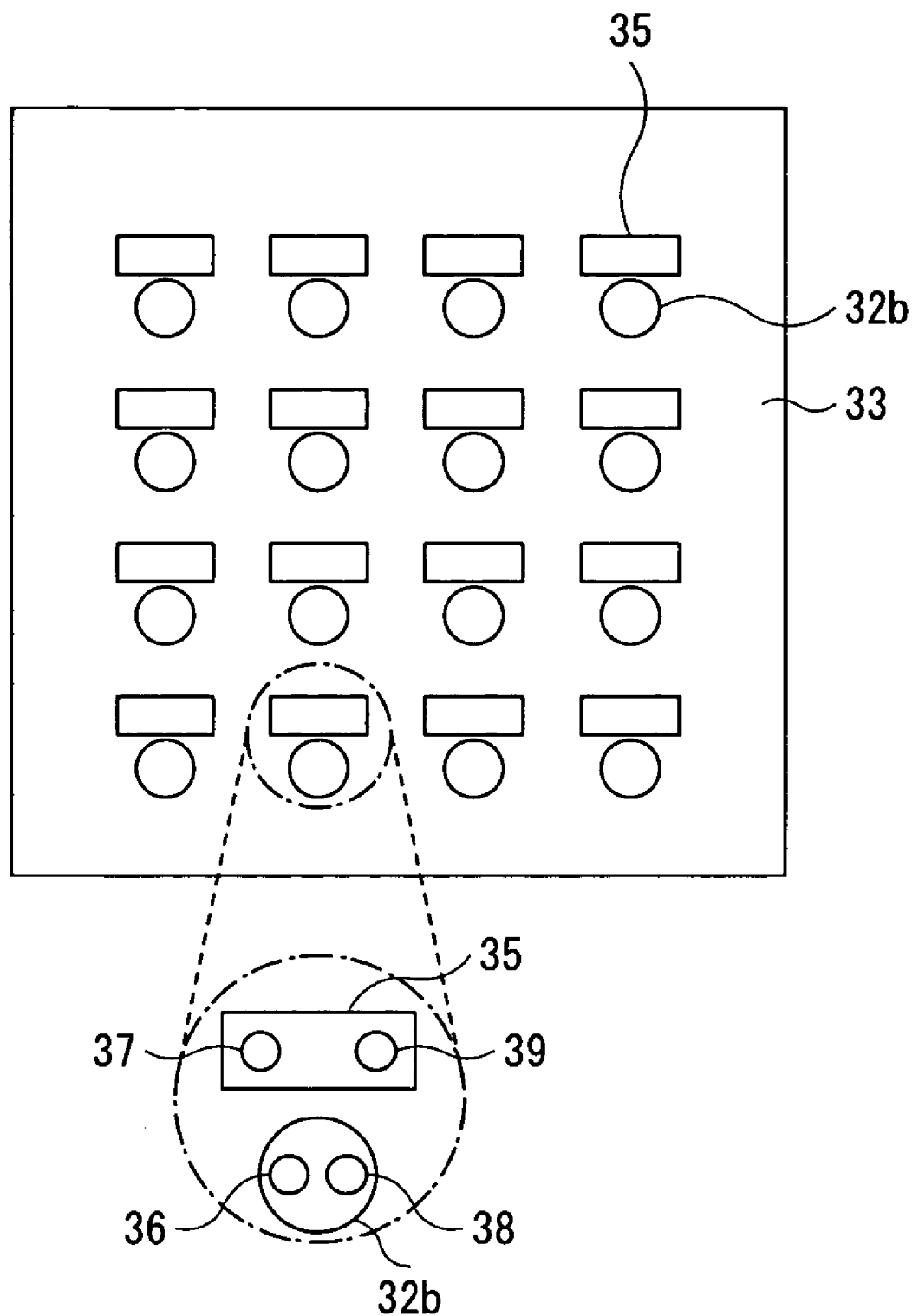
FIG. 16 is a plan view of FIG. 15C.

Subsequently, as shown in FIG. 15B, lift-off is performed by dissolving and removing the resist film 34, and the gold layer 35 is selectively removed. The gold layer 35 becomes one electric contact of the memory cell 20, and is electrically connected to the electrode layer 26. When the resist film 34 is dissolved and removed, the earth terminal part 32b is exposed. However, the earth terminal part 32b is electrically connected to the other electrode layer 22.

Figure 15C:
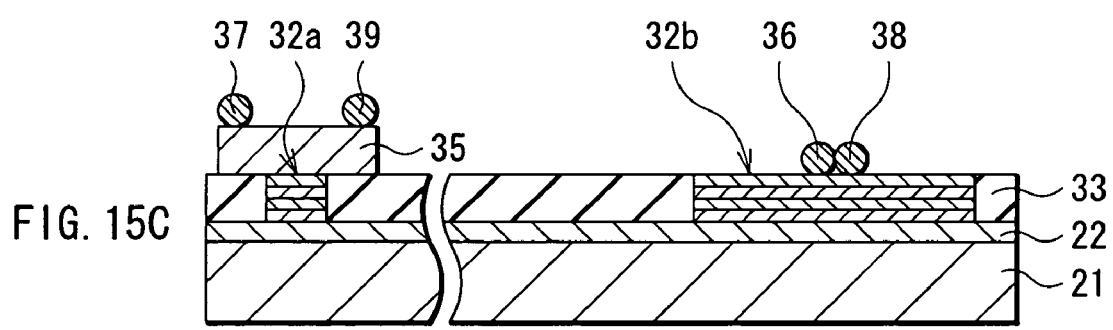

Next, as shown in FIG. 15C, wires for voltage signal 36 and 37 and wires for current pulses 38 and 39 are connected to these electric contacts (earth terminal part 32b and gold layer 35) by bonding. Finally, the substrate 21 on which the memory cell 20 is formed is firmly fixed to a heat sink (not shown) made of copper (Cu). The memory element MM1 is thereby completed.

In the memory element MM1 constructed as above, two magnetization directions $S_1$ and $S_2$ of the ferromagnetic free layer 25 correspond to two recording information in each memory cell 20. By injecting a spin-polarized current flow into this ferromagnetic free layer 25 and switching the magnetization direction, writing "1" or "0" is performed.

Then, the spin-polarized electron flow flows through the spin conduction layer 24. In this embodiment, the spin conduction layer 24 is made of the fullerene thin film (FIG. 3). In the fullerene thin film, orientations of spin of the included paramagnetic material 24b are random. Therefore, the fullerene thin film has stable paramagnetic characteristics. Further, electron spin in the fullerene 24a is in a quantized state in a pseudo zero dimensional space. In addition, by constructing the spin conduction layer 24 from the fullerene thin film, growing a uniform thin film and controlling the spin coherence length can be easily performed. Thereby, in the spin conduction layer 24, a sufficient spin coherence length and a uniform spin field can be obtained, and spin scattering can be prevented. That is, electrons are conducted through the spin conduction layer 24 while the spin polarization degree thereof is maintained.

As described above, in this embodiment, the spin conduction layer 24 has the hollow sized from 0.1 nm to 50 nm, and is made of the fullerene including the paramagnetic material in the hollow. Therefore, it becomes easy to grow a uniform thin film and control a spin coherence length, and a sufficient spin coherence length and a uniform spin field can be obtained. Therefore, it becomes possible to prevent scattering of the spin-polarized conduction electrons, and reliability is improved. Thereby, the spin injection type memory element MM1 can be put into practical use. In particular, compared to the conventional induced magnetic field type, the upper limit of recoding density can be largely improved, and reading time and power consumption can be reduced.

Figure 17:
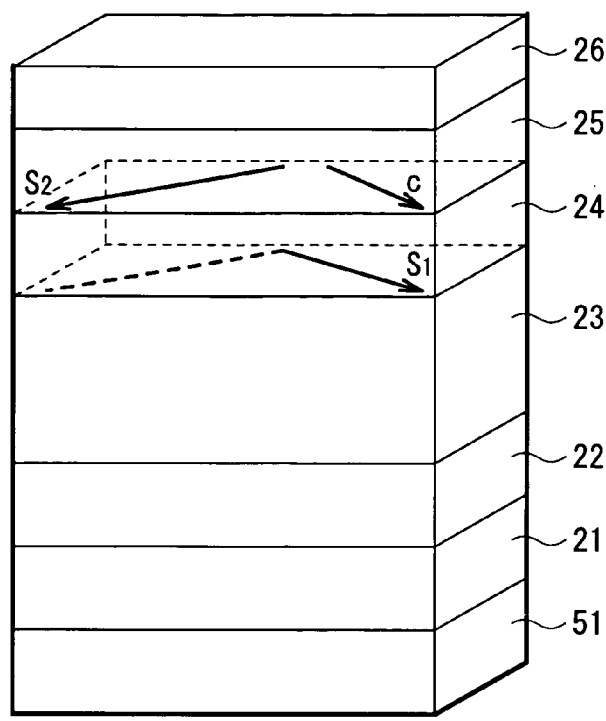
FIG. 17 is a view showing a modification of the memory cell.

The invention has been described with reference to the embodiment. However, the invention is not limited to the foregoing embodiment, and various modifications may be made. For example, it is possible that in order to fix the magnetization direction of the ferromagnetic fixed layer 23 to a given direction, a magnetization fixed layer 51 (refer to FIG. 17) made of, for example, anti-ferromagnetic material is formed over the ferromagnetic fixed layer 23. As an anti-ferromagnetic material, FeMn, IrMn, NiMn, RhMn, CrMnPt, FeMnpt and the like can be cited. Of the foregoing, NiMn is suitable since NiMn can obtain a large pinning field even at high temperatures (for example, about 650 Oe up to T=450 K).

A magnetic moment of the ferromagnetic fixed layer 23 is pinned by such a magnetization fixed layer 51, and its magnetization direction is fixed to a given magnetization direction. When the magnetization fixed layer 51 is made of a metal as a anti-ferromagnetic material, the magnetization fixed layer 51 can also function as an electrode. Further, though the GMR effects are utilized for a method to read the recording information in the foregoing embodiment, for example, magnetic Kerr effect generated when the ferromagnetic free layer 25 is illuminated with light can be utilized.

Figure 18:
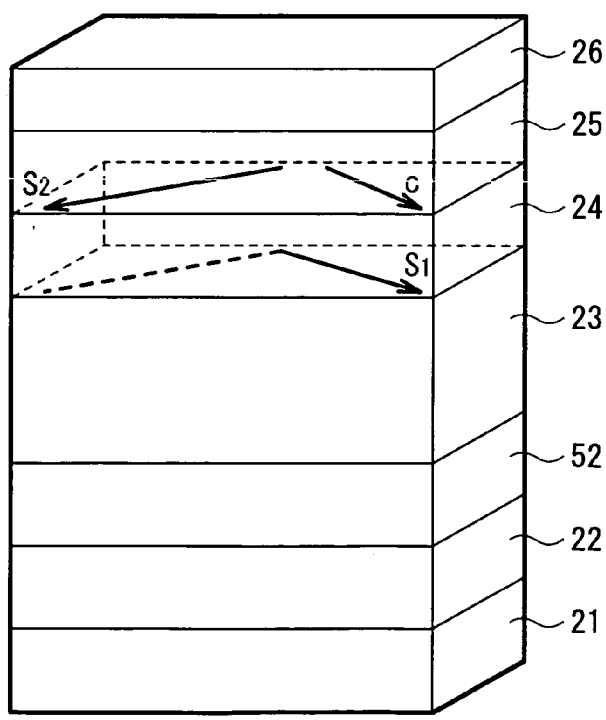
FIG. 18 is a view showing another modification of the memory cell.

Further, as shown in FIG. 18, a spin arrayed layer 52 including a dilute magnetic alloy can be provided in addition to the foregoing spin conduction layer 24. The dilute magnetic alloy is an alloy wherein a magnetic material metal is doped to a semiconductor. On a joint interface between the dilute magnetic material, in which characteristics of the semiconductor are maintained and magnetic order exists and the ferromagnetic metal, magnetization becomes nonequilibrium, and spin-polarized electrons can be generated (source: R. Fiederling, M. Keim, G. Reuscher, W. Ossau G. Schemidt, A. WAAG & L. W. Molenkamp, Nature 402, 787–790 (1999), "Injection and detection of a spin-polarized current in a light-emitting diode").

Therefore, a higher spin polarization degree can be obtained by utilizing this dilute magnetic alloy as the spin arrayed layer 52 which also has a function as a spin conduction layer.

As a dilute magnetic material alloy, for example, (In, Mn)As, (Ga, Mn)As, (Cd, Mn)Te, (Zn, Mn)Te, and (Zn, Cr)Te can be cited.

It is enough that a position of the spin arrayed layer 52 including the dilute magnetic alloy is between two ferromagnetic layers (ferromagnetic fixed layer 23 and ferromagnetic free layer 25). However, the position of the spin arrayed layer 52 including the dilute magnetic alloy is more preferably between the reference, the ferromagnetic fixed layer 23 and the spin conduction layer (spin conduction layer 24), and thereby a polarity degree of conduction spin in spin injection can be improved.

When the dilute magnetic alloy is included in the fullerene contained in the spin conduction layer 24, the spin conduction layer 24 functions as the spin arrayed layer and the spin conduction layer.

Further, it is possible that in order to run other circuit to perform logical operation according to reading results of recording information, for example, an amplification circuit of reading signals can be incorporated into the foregoing nonvolatile RAM. Further, though in the foregoing embodiment, the electrode layer 22, the ferromagnetic fixed layer 23, the spin conduction layer 24, the ferromagnetic free layer 25, and the electrode layer 26 are formed in this order over the substrate 21, deposition order of the respective layers can be opposite to the foregoing order.

EXAMPLE

In this example, a nonvolatile RAM having the following construction was fabricated. Here, constructions from the electrode layer 26 to the substrate 21 will be shown.
<Sample Structure>
Electrode layer: Au film (25 nm thick)
Ferromagnetic free layer: permalloy film made of $Ni_{81}Fe_{19}$ (1 nm thick, and having uniaxial anisotropy so that the c axis becomes parallel to magnetization of the ferromagnetic fixed layer)
Paramagnetic layer: $La@C_{82}$ thin film (20 nm thick)
Ferromagnetic fixed layer: permalloy film made of $Ni_{81}Fe_{19}$ (4 nm thick, and having uniaxial anisotropy)
Electrode layer: Au film (500 nm thick)
Substrate: silicon substrate
Measurement results of the sample structure of this example will be hereinafter shown.
<Calculated Values>
Polarization efficiency: to 90%
In-plane effective anisotropy magnetic field for ferromagnetic free layer: Hu=+2Ku/Ms to 10 Oe
Spin number density: to $1.9 \times 10^{15}$ cm$^2$
Gilbert attenuation coefficient: 0.005
Critical value Jt: to $8 \times 10^3$ A/cm$^2$
Electric resistance: 16 mΩ
Noise voltage (10 Hz BW, 77 k): 0.2 nV
<Measurement Values>
Switching current density by experiment: to $2 \times 10^4$ A/cm$^2$
Switching time θ (0 to π): to 0.05 μsec
Peak power consumption in reading: to 0.1 pW
Reading current density: to $3 \times 10^4$ A/cm$^2$
Reading current pulse: to 5.0 μA, 1 Hz
CPP GMR 4% ΔR/R: to (800 μΩ/20 mΩ)
Average reading voltage: to 5 nV Further, as a comparative example for this example, a nonvolatile RAM was fabricated as in this example, except that an Au film being 20 nm thick was used for the paramagnetic layer. Measurement results of this comparative example will be hereinafter shown.
<Calculated Values>
Polarization efficiency: to 30%
In-plane effective anisotropy magnetic field for free layer: Hu=+2Ku/Ms to 10 Oe
Spin number density: to $1.9 \times 10^{15}$ cm$^2$
Gilbert attenuation coefficient: 0.01
Critical value Jt: to $8 \times 10^3$ A/cm$^2$
Electric resistance: 16 mΩ
Noise voltage (10 Hz BW, 77 k): to 0.3 nV
<Measurement Values>
Switching current density by experiment: to $2 \times 10^4$ A/cm$^2$
Switching time θ (0-π): to 0.1 μsec Peak power consumption in reading: to 0.1 pW
Reading current density: to $4\times10^3$ A/cm$^2$
Reading current pulse: to 6.4 µA, 1 Hz
CPP GMR 4% ΔR/R: to (800 µΩ/16 mΩ)
Average reading voltage: to 5 nV As evidenced by the foregoing, in this example, polarization efficiency could be significantly improved by using the La@C$_{82}$ film for the paramagnetic layer instead of the Au film. That is, it was found that when the La@C$_{82}$ film was used for the paramagnetic layer instead of the Au film, performance of the nonvolatile RAM could be improved.

Further, as a comparative example to this example, measurement results of the conventional induced magnetic field type memory element will be hereinafter shown.

<Measurement Values>
Switching current density: to $5.8\times10^6$ A/cm$^2$
Switching timeθ (0 to π): to 0.08 µsec
Peak power consumption in reading: to 1.0 pW
Reading current density: to $1\times10^5$ A/cm$^2$
Reading current pulse: to 5.0 µA, 1 Hz
CPP GMR 4% ΔR/R: to (800 µΩ/20 mΩ)
Average reading voltage: to 40 nV Compared to the conventional induced magnetic field type memory element, respective characteristics were improved as follows: the current required for switching and writing was increased by two-digit order; the switching time was increased by one-digit order; and the power consumption was increased by one-digit order. That is, it was found that compared to the conventional induced magnetic field type memory element, the spin injection type memory element could reduce reading time and power consumption.

Next, another embodiment of the invention will be described.

(Second Embodiment)

Figure 19:
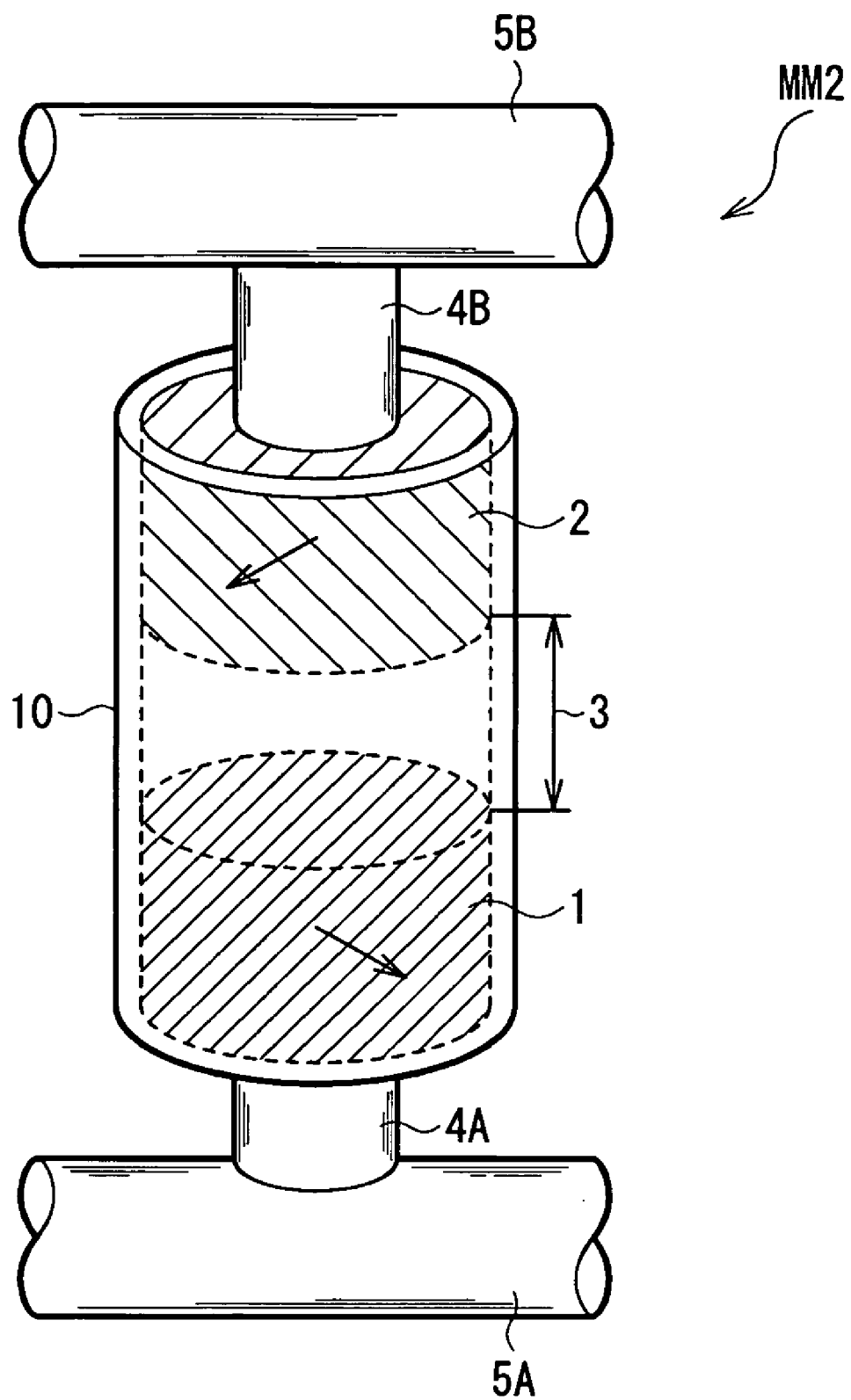
FIG. 19 is a view showing a construction of a memory element according to a second embodiment of the invention.

FIG. 19 shows a construction of a memory element according to a second embodiment of the invention. This memory element MM2 is also "spin injection type" wherein writing is performed by generating magnetization inversion by injecting polarized spin electrons. A basic structure thereof is that a spin conduction layer 3 is provided between two ferromagnetic layers, that is, a fixed layer 1 wherein its magnetization orientation is fixed to a certain direction, and a free layer 2 wherein its magnetization orientation is changed by injecting the polarized spin electrons.

These respective layers are formed in layers inside a carbon nanotube 10 of one molecule. That is, the carbon nanotube 10 constructs one composition unit of a memory by setting a central part in the axis direction to the spin conduction layer 3, and including the fixed layer 1 and the free layer 2 in the both ends thereof Further, the fixed layer 1 and the free layer 2 are provided with electrode layers 4A and 4B, respectively. The individual magnetic memory element MM2 is connected to wiring layers 5A and 5B through the electrode layers 4A and 4B.

The spin conduction layer 3 is constructed from part of the hollow carbon nanotube 10. The spin conduction layer 3 is constructed from a nonmagnetic material to shield magnetic interaction between the fixed layer 1 and the free layer 2. Further, a spin coherence length of the spin conduction layer 3 should be longer than at least a layer thickness itself, in order to conduct polarized spin electrons between the fixed layer 1 and the free layer 2. Regarding the carbon nanotube, various reports suggesting its ballistic conduction have been made. Recently, it has been experimentally confirmed that its spin coherence length is 200 nm or more (K. Tsukagoshi, B. W. Alphenaar and H. Ago, "Spin coherent transport in a ferromagnetically contacted carbon nanotube," Nature 401, 572–574 (1999)). Meanwhile, a thickness of the spin conduction layer 3 here (length of the carbon nanotube) is about from 0.5 nm to 5 µm as a practical range. Therefore, this spin conduction layer 3 concurrently satisfies the foregoing two conditions.

As described above, in this embodiment, (1) part of the carbon nanotube 10 is utilized as the spin conduction layer 3, and (2) the carbon nanotube 10 constructs an outer hull of the whole element.

In Japanese Patent Publication No. 2546114, a technique to include various different substances in a hollow hole placed in a center of a carbon nanotube is disclosed. Regarding a carbon nanotube including a magnetic material, descriptions are given as follows: (1) since a tube internal diameter (5 to 10 nm) is smaller than a magnetic domain size of a general magnetic material, such a carbon nanotube is considered as a simple magnetic domain particle, and (2) when the tubes are arranged so that their long axes are placed vertically, a perpendicular magnetic recording medium having a very high density can be realized due to the anisotropy. However, in the foregoing Japanese Patent Publication No. 2546114, there is no description on application of the carbon nanotube to a memory.

The largest effects obtained from that the carbon nanotube 10 is used as an outer hull of the element is that it becomes possible to prevent effects of proximal magnetic fields to the inside thereof due to magnetic shielding effects by its π electron cloud. The magnetic memory element MM2 of this embodiment is characterized by the current-driven type. However, if its size (cell size) becomes nano order, a leakage magnetic field generated by a reading current may disturb magnetization of proximal cells. However, since the carbon nanotube 10 covers the magnetic layers inside the element, and shields magnetic disturbance from the outside, magnetization directions of the fixed layer 1 and the free layer 2 are always maintained stably. Thereby, the magnetic memory element MM2 becomes an element, which is fine sized, and can be integrated and driven practically.

Further, an internal diameter of the carbon nanotube 10 is very little, which is about from 1 to 10 nm. That is, such a fine element can be formed without depending on the conventional semiconductor processing technology. At the same time, the size is considerably smaller than the magnetic domain size of the general magnetic material. Therefore, it is thinkable that the magnetic material has a simple magnetic domain structure inside the carbon nanotube 10. In the result, since transport of the magnetic domain to magnetization is not associated, it is expected that retentivity of the magnetic material becomes larger.

Examples of the ferromagnetic materials used for the fixed layer 1 and the free layer 2 include simple substances of Fe and Co, binary alloys thereof, NiFe alloy, MnFeCo, and FeCoNi. Of the foregoing, the ferromagnetic material effective to obtain a high polarity ratio of electrons is FeCo alloy having a high Fe content ratio. Itinerant d electrons of 3d ferromagnetic material have isotropic and free-electron-wise wavenumber vectors. Therefore, it is not rather necessary to consider crystal orientation. It is preferable that the fixed layer 1 is selected from a hard magnetic material containing Ni, Co and the like, and the free layer 2 is selected from a soft magnetic material such as pure iron and permalloy (Ni$_{79}$Fe$_{21}$). Further, metal nanoparticle materials such as spinel type ferrimagnetic particles whose main component is iron oxide containing cobalt nickel, whose high retentivity has recently become known (crystal particle diameter: φ to 30 nm, coercivity: HcJ to 6 k Oe), and FeO$_2$ particles (firing temperature: 1023 K, crystal particle diameter: φ to 5 nm, HcJ to 1 k Oe) can be used.

For the fixed layer 1, in order to maintain the constant magnetization orientation, it is preferable that a material whose gilbert attenuation coefficient is significantly larger than of the free layer 2 is used, or uniaxial anisotropy larger than of the free layer 2 is applied by adjusting its composition and its layer thickness (thicker than of the free layer 2). Otherwise, it is possible that an anti-ferromagnetic layer is contacted to the fixed layer 1 to pin the magnetization. When the anti-ferromagnetic layer is made of a metal, the anti-ferromagnetic layer also has a function as the electrode layer 4A. Examples of such a anti-ferromagnetic metal material include FeMn, IrMn, NiMn, and RhMn.

Meanwhile, it is preferable that the free layer 2 is provided with uniaxial anisotropy of anisotropic magnetic field Hu>100 Oe by optimizing its composition, thickness, cross section area (diameter of the carbon nanotube 10) and the like in order to prevent fluctuation of the magnetization direction (memory state) due to influence of heat or magnetic fields. The magnetization direction of the free layer 2 can be changed in the in-plane two directions, or can be changed in the in-plane direction and the direction perpendicular to the plane. In the latter case, it is preferable that a thickness of the free layer 2 is 5 atomic layers or less, that is, about 1 nm, in order to obtain sufficient perpendicular magnetic anisotropy.

Any type of the electrode layers 4A and 4B can be used, as long as the electrode layers 4A and 4B are made of paramagnetic metals having conductivity. A thickness and a shape thereof are not particularly limited. This magnetic memory element MM2 is included in the hull of the carbon nanotube. Dimensions of the magnetic memory element MM2 are smaller than of the general memory element, and a ratio of its thickness is higher than of its cross section. Therefore, the electrode layers 4A, 4B and the wiring layers 5A, 5B can be formed by using the conventional semiconductor processing technology, or can be constructed from a molecule wire such as the carbon nanotube.

In this magnetic memory device MM2, as described later, both writing and reading are performed by applying a current. Therefore, wirings for writing and reading can be shared, and it is enough to use two wiring layers 5A and 5B. Such simplicity of the wiring structure is one of the advantages thereof.

Figure 20:
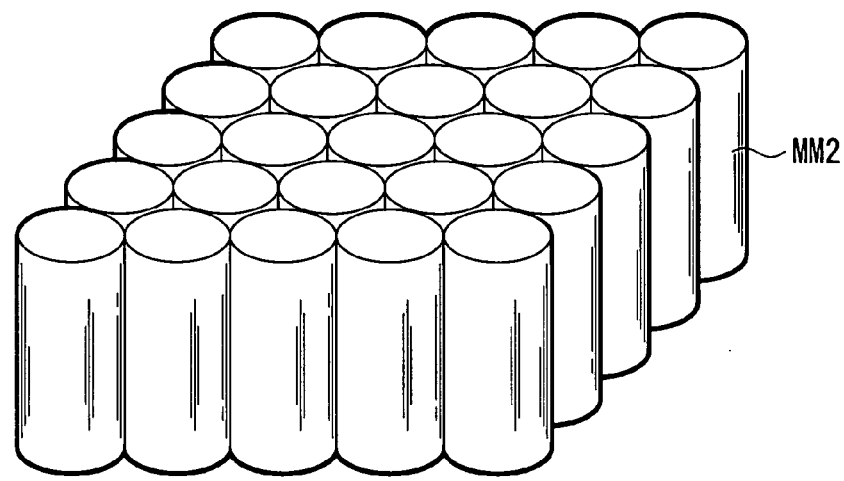
FIG. 20 is an outline construction view of a memory device constructed by integrating the memory elements shown in FIG. 19.

Further, in the magnetic memory element MM2, the carbon nanotube 10 is used as an outer hull of the element. Therefore, the magnetic memory element MM2 is also characterized by integration. In general, the carbon nanotubes easily form a conglomeration body called a bundle. The outer hull of the magnetic memory element MM2 is constructed from the carbon nanotube 10. Therefore, integration is easily made by conglomeration. For example, as shown in FIG. 20, when the magnetic memory elements MM2 are arranged in a state of a matrix, this regular arrangement is maintained by dispersion force (force for conglomeratizing the carbon nanotube 10), and a memory body of a magnetic memory device is constructed from the integrated magnetic memory elements MM2. Thereby, the memory device having a high density and high reliability whose unit memory cell is one carbon nanotube can be fabricated.

Such a magnetic memory element MM2 and its magnetic memory device can be manufactured by, for example, producing an oriented carbon nanotube by using oriented carbon nanotube production method (Jeong et al., Chem. Mater., Vol 14, No. 4, pp 1859–1862 (2002)), filling a magnetic metal in a hollow part of the tube, and performing electric joint at end parts. Specific descriptions of this method will be given later as an example.

Next, an operation method thereof will be hereinafter described. In the magnetic memory element MM2, information is recorded by making a state wherein a magnetization direction of the free layer 2 to the fixed layer 1 is parallel magnetization alignment and a state wherein a magnetization direction of the free layer 2 to the fixed layer 1 is anti-parallel magnetization alignment correspond to binary data such as "0" and "1." Data is written by inverting the magnetization direction of the free layer 2 by a pulse current applied in the direction perpendicular to the layer face (CPP: Current Perpendicular to Plane). For example, when magnetization of the free layer 2 to the fixed layer 1 is changed from the parallel magnetization alignment to the anti-parallel magnetization alignment, a current density pulse is applied from the fixed layer 1 to the free layer 2, and spin polarized electrons are injected from the free layer 2 to the fixed layer 1. Then, a magnitude of the current needs to be larger than the critical current density value with which magnetic inversion is generated in the free layer 2. During this pulse application, the magnetization direction of the free layer 2 is inverted, and the state of parallel magnetization alignment of the free layer 2 and the fixed layer 1 is changed to the state of anti-parallel magnetization alignment thereof.

On the contrary, when the state of anti-parallel magnetization alignment is changed to the state of parallel magnetization alignment, current is applied in the opposite direction. That is, a current is applied from the free layer 2 to the fixed layer 1, and the spin-polarized electrons are injected from the fixed layer 1 to the free layer 2.

Here, since the spin conduction layer 3 is constructed from the carbon nanotube, polarized electrons are conducted through the layer without spin relaxation. Therefore, electrons are injected into the fixed layer 1 and the free layer 2 in a state that their spin angular momentum is maintained, and reading can be performed effectively.

Reading data, that is, identifying the foregoing two magnetization states can be performed by using, for example, giant magnetoresistive effects in the direction perpendicular to the layer face (CPP-GMR: Giant Mgneto-Resistive). In addition, there is a method using magnetic Kerr effect.

As described above, in the spin injection type magnetic memory element MM2 in this embodiment, two ferromagnetic layers, that is, the fixed layer 1 and the free layer 2 are filled respectively in the both ends of the one molecule carbon nanotube 10, and the hollow part itself in the center is set to the spin conduction layer 3. Therefore, the spin conduction layer 3 has good spin coherence of the carbon nanotube. The polarized electrons are injected into the fixed layer 1 and the free layer 2 without spin relaxation. Therefore, writing can be performed effectively, and low-power-consumption driving is enabled.

Further, the main body of the memory element is housed inside the hull of the carbon nanotube 10. Therefore, the nano-sized element can be realized without depending on the conventional microfabrication technology. Therefore, it is possible to obtain a very high density memory device by using this magnetic memory element MM2. In this case, it is thinkable that the fixed layer 1 and the free layer 2 have the single magnetic domain structure, and stable magnetization orientations can be maintained. Further, the magnetization orientations can be always stably maintained also by the fact that the π electron cloud of the carbon nanotube 10 covers the fixed layer 1 and the free layer 2, and shields magnetic disturbance from the outside. Further, the carbon nanotube 10 has the one dimensional shape and dispersion force works between the tubes. Therefore, conglomeration is realized in the axis direction. Consequently, the magnetic memory element MM2 can be highly oriented stably and easily, and the highly integrated magnetic memory device can be obtained.

Figure 21:
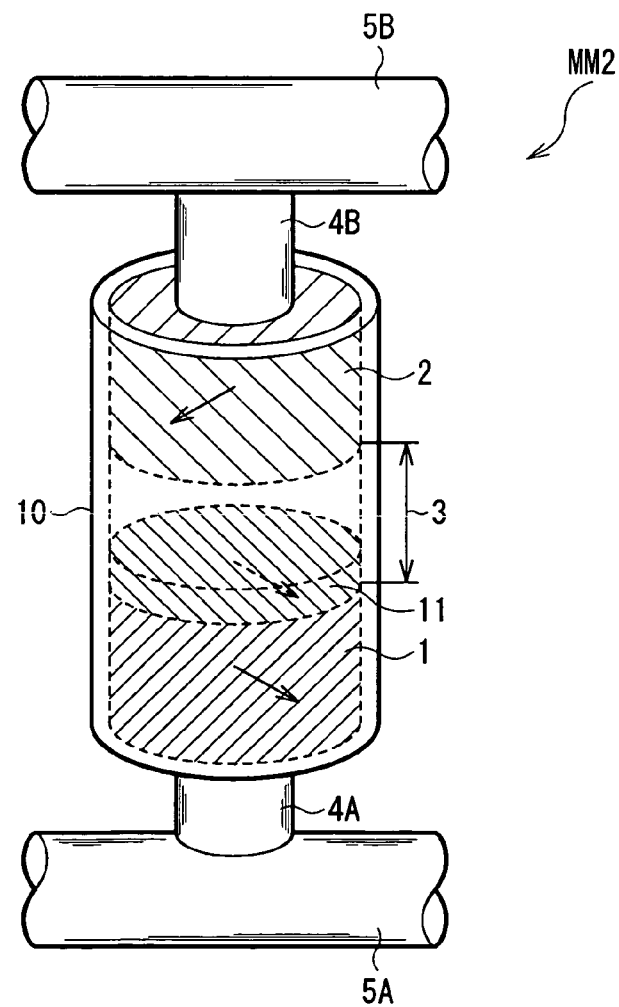
FIG. 21 is a view showing a modification of the memory element.
Figure 22:
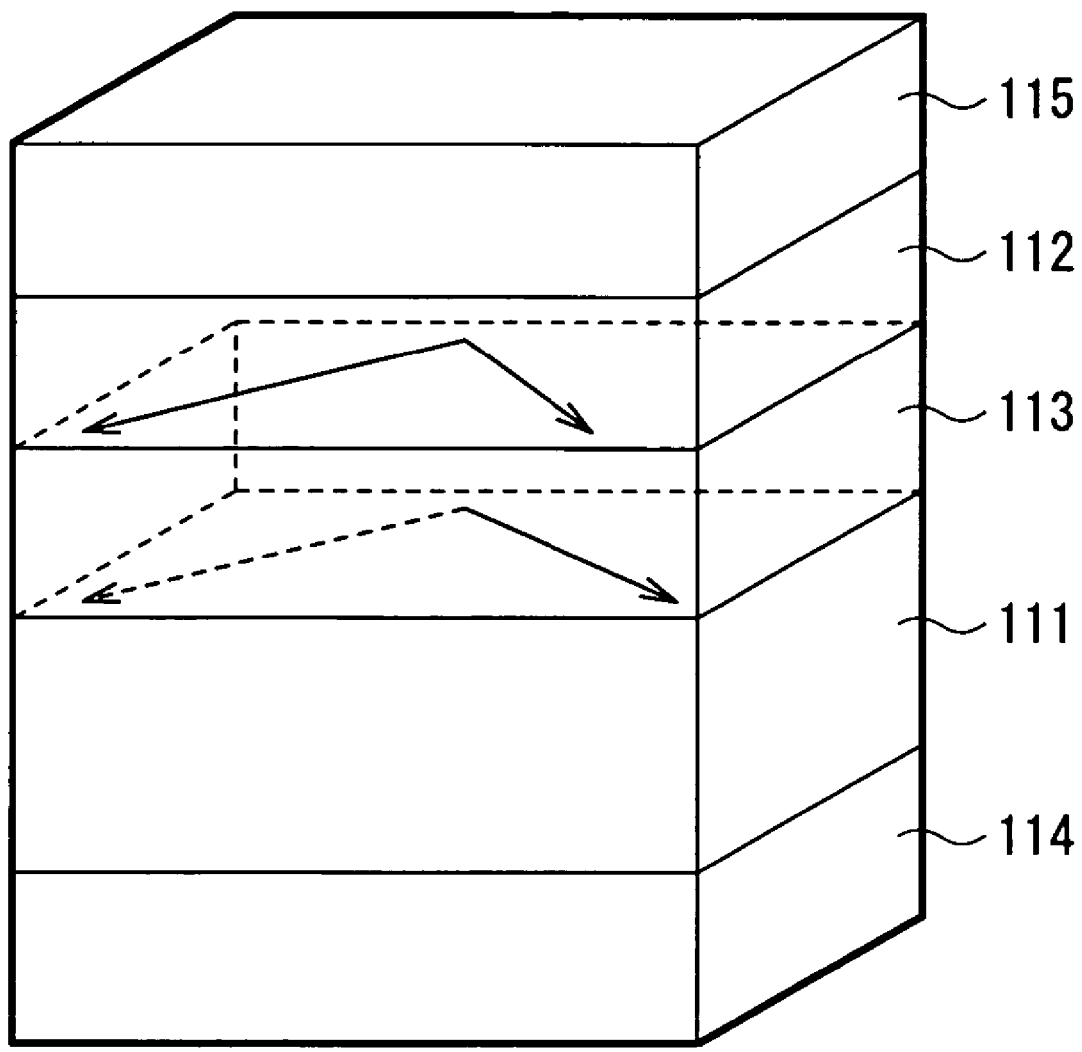
FIG. 22 is a construction view of a conventional spin injection type memory element.

Further, a higher spin polarization degree can be obtained by providing a spin arrayed layer 11 including a dilute magnetic alloy as in the first embodiment, as shown in FIG. 21 in addition to the foregoing spin conduction layer 3. It is enough that a position of the spin arrayed layer 11 is between two ferromagnetic layers (ferromagnetic fixed layer 1 and ferromagnetic free layer 2). However, the position is more preferably between the reference ferromagnetic fixed layer 1 and the spin conduction layer 3. Thereby, a polarization degree of the conduction spin in spin injection can be improved.

Further, a specific example of the invention will be hereinafter described in detail.

Example 1

First, a high purity aluminum sheet (99.999%) was degreased by acetone, and washed with ethanol solution. The resultant was electropolished in a mixed solution of perchloric acid and ethanol. Subsequently, the resultant was anodized at 40 V in 0.3 M of oxalic acid at 15° C. for 12 hours. Thereby, an anodized alumina substrate with fine pores was obtained. These fine pores were self-assembled as a nano-size ordered porous structure, and form an ordered array over a long distance. The practically obtained fine pore passed through the alumina substrate (that is, the fine pore was in a state that its both ends were opened), and its diameter was 80 nm and its density was $1.0 \times 10^{10}$ pores/cm$^2$.

Next, the alumina substrate was precipitated in $CoSo_4 \cdot 7H_2O$ solution, and applied with 18 V AC for 1 minute. Thereby, Co catalyst was electrochemically precipitated on a bottom part of the fine pores of the substrate. Co particles on the surface were deoxidized by exposing the substrate to a mixed gas of 10% of $H_2$ and 90% of Ar at 500° C. for 1 hour. This Co catalyst was a catalyst for producing the carbon nanotube, and would become the magnetic layer (fixed layer) of the magnetic memory element.

Next, 10% of $C_2H_2$ and 20% of $H_2$ were contained in Ar carrier gas, which was provided to the foregoing resultant to grow the carbon nanotubes in the fine pores of the substrate by thermal decomposition method.

Extra grown portions of the carbon nanotubes were cut by providing ultrasonic treatment with 40 kHz in acetone solution for the whole substrate. Thereby, nanotubes having the same length oriented in the axis direction were obtained.

Next, the whole substrate with the carbon nanotubes was soaked in an acid bath containing iron ions and hypophosphite as a reducing agent, and pure iron was filled in the carbon nanotubes until metallic color was shown by using electroless plating method. Thereby, the individual carbon nanotube obtained a basic structure of the spin injection type magnetic memory element. That is, a Co layer of a hard magnetic material as the fixed layer, a hollow nanotube as the spin conduction layer 3, and a Fe layer as the free layer are formed. As an electrode and an extraction wiring, nanotubes with a thinner diameter were jointed at both ends of this nanotube including magnetic material by atom manipulation method.

Further, the whole alumina substrate of these nanotubes was laid on an insulative substrate made of $SiO_2$, and soaked in 0.1 M of NaOH at 70° C. for 3 hours, and thereby the alumina substrate was decomposed and removed. Then, a bundle structure constructed from the nanotubes including magnetic material and tubes to become electrodes and wirings remained on the insulative substrate.

Next, a signal wiring was bonded to the extraction wiring, which was used as a two dimensional lattice wiring to obtain the address. Finally, the insulative substrate was firmly fixed to a Cu heat sink. The magnetic memory device was thereby completed.

Further, characteristics of the fabricated magnetic memory device were measured. The results will be hereinafter shown.

<Calculated Values>
Polarization efficiency: to 50%
In-plane effective anisotropy magnetic field for free layer: Hu=+2Ku/Ms to 100 Oe
Spin number density: to $5.0 \times 10^{15}$ cm$^2$
Gilbert attenuation coefficient: 0.01
Critical value Jt: to $8 \times 10^3$ A/cm$^2$
Electric resistance: 16 mΩ
Noise voltage (10 Hz BW, 77 k): 0.2 nV
<Measurement Values>
Switching current density by experiment: to $1 \times 10^4$ A/cm$^2$
Switching timeθ (0-π): to 0.05 μsec
Peak power consumption in reading: to 0.1 pW
Reading current density: to $3 \times 10^3$ A/cm$^2$
Reading current pulse: to 6.4 μA, 1 Hz
CPP-GMR 4% ΔR/R: to (800 μΩ/16 mΩ)
Average reading voltage: to 5 nV
Magnetic recording density: to 6.5 Gbit/inch$^2$ The measured recording density can be improved by controlling the fine pore diameter of the anodized alumina substrate, and optimizing the nanotube diameter, that is, the diameter of the magnetic memory element. It is possible to control the fine pore diameter in the range from several 10 to several 100 nm by controlling a starting point of the fine pore growth by, for example, ion sputtering method with Ar, Ga and the like to the electropolished aluminum substrate.

Example 2

The carbon nanotube including the ferromagnetic metal can be obtained by making a graphite electrode used in synthesis by arc discharge method and the like contain the ferromagnetic metal. In this example, the magnetic memory device was assembled by the carbon nanotube obtained as above.

First, a mixture in which Ni, Y, and permalloy (NiFe alloy) powders were added at a weight ratio of 4%, 1%, and 4% to graphite powders was fabricated. Further, carbon pitch was added to the mixture, which was fired at 900° C. for 6 hours. Arc discharge by contact arc method was performed in He atmosphere and 200 Torr by using the resultant as a cathode electrode.

Obtained carbon shoot was dispersed in the magnetic field, and thereby a nanotube including magnetic material was selectively taken out. Since Ni works as a catalyst for producing the carbon nanotube, Ni is included in an end of almost all tubes. Therefore, tubes in which the permalloy is filled in other end need to taken out selectively. Next, of the obtained magnetic nanotubes, only the tubes in which the ferromagnetic Ni is included one end and the permalloy is included in other end were collected by visually checking with a scanning electron microscope.

Each of these collected carbon nanotubes has a basic structure as the spin injection type magnetic memory element. That is, an Ni layer of a hard magnetic material as the fixed layer, a hollow nanotube as the spin conduction layer, and a permalloy layer as the free layer were formed. These carbon nanotubes are conglomeratized by Van der Waals' forces at intervals of about 0.3 nm from each other.

As an electrode and a lead wiring, nanotubes with a thinner diameter were jointed at both ends of this nanotube including magnetic material by atom manipulation method.

After that, a magnetic memory device was completed by using subsequent steps similar to Example 1.

The invention is not limited to the foregoing embodiments and examples, and various modifications may be made. For example, in the second embodiment, the part of the spin conduction layer 3 of the carbon nanotube 10 was used as a hollow part. However, it is possible to contain a conductive paramagnetic material having a long spin coherence length. Examples thereof include carbon materials such as fullerene, 3d metals other than anti-ferromagnetic metal such as Ag and Au, and 4d metals.

In the second embodiment, the magnetic memory element wherein the main part is formed in the carbon nanotube 10 has been described. However, it is possible that the carbon nanotube 10 is substituted with other cylindrical molecule such as a boron nitride (BN) tube and a peptide nanotube. In this case, it is possible to improve characteristics by filling the foregoing carbon material or metal in the part corresponding to the spin conduction layer 3.

Further, in the second embodiment, the carbon nanotube 10 includes the fixed layer 1 and the free layer 2. It is possible that the carbon nanotube 10 includes part of the electrode layers 4A and 4B in order to improve bonding characteristics. It is enough that in the magnetic memory element in the invention, at least the spin conduction layer provided between the fixed layer and the free layer is constructed from the cylindrical molecule as typified by the carbon nanotube. It is optional whether other components for the element are included or not. However, as mentioned above, it is expected that the conductive cylindrical molecule could give magnetic shielding effects, and therefore, the inclusive structure is preferably selected according to need.

According to the memory element or the memory device of the invention, the spin conduction layer is constructed from the spherical shell or cylindrical molecule material having a hollow. Therefore, it becomes easy to control the spin coherence length, and the sufficient spin coherence length and a uniform spin field can be obtained. Therefore, it becomes possible to prevent scattering of the spin-polarized conduction electrons in the paramagnetic layer, to improve reliability, and thereby to attain practical use thereof. Further, compared to the conventional induced magnetic field method, the upper limit of the recording density can be significantly improved, and reading time and power consumption can be reduced. In particular, the uniform thin film can be grown by forming the spin conduction layer from the spherical shell molecule material including the paramagnetic material.

Further, the spin conduction layer is constructed from the cylindrical molecule, and the central part in the axis direction of this cylindrical molecule functions as the spin conduction layer. In addition, the first ferromagnetic layer is included in one end of this cylindrical molecule, and the second ferromagnetic layer is included in the other end thereof. Thereby, construction wherein the element body is housed in the hollow part of the cylindrical molecule is obtained. Therefore, the nano-sized spin injection type memory element can be realized without depending on the conventional microfabrication technology by selecting the nano-sized cylindrical molecule. That is, despite of its fine size, the element whose dimensions are well controlled can be obtained by the simple manufacturing method. In this case, it is thinkable that the first and the second ferromagnetic layers have simple magnetic domain structure due to the diameter size of the cylindrical molecule. Further, since these layers are included in the cylindrical molecule, magnetic disturbance from the outside is shielded. Therefore, the magnetization direction can be stably maintained. Due to the magnetic shielding effects, integration becomes practically enabled despite of its fine size.

Further, by using the carbon nanotube as the cylindrical molecule, in the spin conduction layer, polarized electrons are conducted while almost no spin is relaxed due to good spin coherence of the carbon nanotube, and the polarized electrons are injected into the first ferromagnetic layer or the second ferromagnetic layer. Therefore, it is possible to realize the nano-sized spin injection type memory element having good writing efficiency.

Further, according to the memory device of the invention, the plurality of memory elements of the invention are arrayed. Therefore, writing can be performed effectively, and low-power-consumption drive is enabled. In particular, when the individual memory element is constructed by using the cylindrical molecule, the cylindrical three dimensional structure can be obtained differently from the element which is two dimensionally formed by the conventional thin film fabrication technology. Therefore, the memory elements can be integrated in the vertical direction. Further, this memory element is the spin injection type memory element, and hardly receive influence of adjacent magnetic fields compared to other magnetic memories. Therefore, a distance between memory cells can be further narrowed, and high density integration becomes enabled.

The invention claimed is:

1. A memory element wherein recording information is written by injecting spin-polarized electrons, the memory element comprising:
   a spin conduction layer made of a spherical shell or cylindrical molecule material having a hollow portion, and wherein
   the spin-polarized electrons are conducted by the spin conduction layer.

2. A memory element according to claim 1 comprising:
   a first ferromagnetic layer wherein a magnetization direction is fixed;
   a spin conduction layer made of a spherical shell molecule material having a hollow portion in which a paramagnetic material is included and having a given spin coherence length, which is formed over the first ferromagnetic layer; and
   a second ferromagnetic layer formed on the spin conduction layer on a side opposite to the first ferromagnetic layer, wherein a magnetization direction is changed by the spin-polarized electrons, wherein
   the recording information is written by changing the magnetization direction of the second ferromagnetic layer.

3. A memory element according to claim 2, wherein the spherical shell material constructing the spin conduction layer is carbon molecule fullerene.

4. A memory element according to claim 3, wherein the spherical shell molecule material is carbon molecule fullerene having a hollow portion sized from 0.1 nm to 50 nm.

5. A memory element according to claim 2, wherein a thickness of the spin conduction layer is from 0.5 nm to 5 µm.

6. A memory element according to claim 2, wherein the paramagnetic material included in the spherical shell molecule material is lanthanum (La), cesium (Cs), dysprosium (Dy), europium (Eu), or gadolinium (Gd).

7. A memory element according to claim 2, wherein the paramagnetic material included in the spherical shell molecule material is nitrogen (N) or phosphorous (P).

8. A memory element according to claim 2, further comprising a spin arrayed layer between the first ferromagnetic layer and a second ferromagnetic layer.

9. A memory element according to claim 8, wherein the spin arrayed layer includes a dilute magnetic material.

10. A memory element according to claim 9, wherein the dilute magnetic material is made of at least one of (In, Mn)As, (Ga, Mn)As, (Cd, Mn)Te, (Zn, Mn)Te, and (Zn, Cr)Te.

11. A memory element according to claim 2, wherein the spherical shell molecule material includes a dilute magnetic material, and the spin conduction layer also functions as a spin arrayed layer.

12. A memory element according to claim 2, wherein a thickness of the first ferromagnetic layer is thicker than a thickness of the second ferromagnetic layer.

13. A memory element according to claim 2 further comprising a magnetization fixed layer for fixing the magnetization direction of the first ferromagnetic layer on an opposite side of the first ferromagnetic layer to the spin conduction layer.

14. A memory element according to claim 13, wherein the magnetization fixed layer is made of an anti-ferromagnetic material.

15. A memory element according to claim 13, wherein the magnetization fixed layer also functions as an electrode.

16. A memory element according to claim 2, wherein a thickness of the second ferromagnetic layer is 5 atomic layers or less.

17. A memory element according to claim 2, wherein electrodes are formed at both of two faces of the memory element respectively, and the electrodes are made of a paramagnetic metal material.

18. A memory element according to claim 2, wherein a writing line for injecting the spin-polarized electrons is connected to the second ferromagnetic layer.

19. A memory element according to claim 2, wherein a cell area is from 0.5 $nm^2$ to 5 $\mu m^2$.

20. A memory element according to claim 2, wherein the recording information is read by utilizing giant magnetoresistive effects generated in applying a current.

21. A memory element according to claim 2, wherein the recording information is read by illuminating the second ferromagnetic layer with light, and utilizing magnetic Kerr effect then generated.

22. A memory element according to claim 1 comprising:
first and second ferromagnetic layers wherein a magnetization direction change of at least one thereof is induced by injecting spin-polarized electrons; and
a spin conduction layer constructed from at least part of a hollow cylindrical molecule arranged by setting its axis direction to a laminating direction of the first and the second ferromagnetic layers, which is provided between the first ferromagnetic layer and the second ferromagnetic layer to shield magnetic interaction thereof and which conducts the spin-polarized electrons.

23. A memory element according to claim 22, wherein a central part in the axis direction of the cylindrical molecule functions as the spin conduction layer, and the first ferromagnetic layer and the second ferromagnetic layer are included in one end and an other end, respectively.

24. A memory element according to claim 22, wherein a molecule of the cylindrical molecule is a composition unit of the element.

25. A memory element according to claim 22, wherein the spin conduction layer made of the cylindrical molecule has a length in its axis direction which is shorter than its spin coherence length at operation temperatures.

26. A memory element according to claim 22, wherein the spin conduction layer made of the cylindrical molecule includes another molecule or atom in a hollow part.

27. A memory element according to claim 22 comprising a spin arrayed layer between the first ferromagnetic layer and the second ferromagnetic layer.

28. A memory element according to claim 27, wherein the spin arrayed layer includes a dilute magnetic material.

29. A memory element according to claim 28, wherein the dilute magnetic material is made of at least one of (In, Mn)As, (Ga, Mn)As, (Cd, Mn)Te, (Zn, Mn)Te, and (Zn, Cr)Te.

30. A memory element according to claim 26, wherein a spin coherence length of the molecule or the atom included in the hollow part at operation temperatures is longer than a length of the spin conduction layer in the axis direction of the cylindrical molecule.

31. A memory element according to claim 22, wherein the cylindrical molecule is a carbon nanotube.

32. A memory device constructed from an arrayed plurality of memory elements, wherein
the memory elements comprise a spin conduction layer made of a spherical shell or cylindrical molecule material having a hollow portion, and wherein spin-polarized electrons are conducted by the spin conduction layer.

33. A memory device according to claim 32, wherein the memory elements comprise:
a first ferromagnetic layer wherein a magnetization direction is fixed;
a spin conduction layer made of a spherical shell molecule material having a hollow portion in which a paramagnetic material is included and having a given spin coherence length, which is formed over the first ferromagnetic layer; and
a second ferromagnetic layer formed on the spin conduction layer on a side opposite to the first ferromagnetic layer, wherein a magnetization direction is changed by the spin-polarized electrons, wherein
recording information is written by changing the magnetization direction of the second ferromagnetic layer.

34. A memory device according to claim 33, wherein the spherical shell molecule material constructing the spin conduction layer is carbon molecule fullerene.

35. A memory device according to claim 32, wherein the memory elements comprise:
first and second ferromagnetic layers wherein a magnetization direction change of at least one thereof is induced by injecting the spin-polarized electrons; and
a spin conduction layer constructed from at least part of a hollow cylindrical molecule arranged by setting its axis direction to a laminating direction of the first and the second ferromagnetic layers, which is provided between the first ferromagnetic layer and the second ferromagnetic layer to shield magnetic interaction thereof and which conducts the spin-polarized electrons.

36. A memory device according to claim 35, wherein the memory elements are integrated by being arrayed by aligning the axis directions of the cylindrical molecules.

* * * * *